(12) United States Patent
Chung et al.

(10) Patent No.: US 7,842,390 B2
(45) Date of Patent: Nov. 30, 2010

(54) CHAIN END FUNCTIONALIZED FLUOROPOLYMERS HAVING GOOD ELECTRICAL PROPERTIES AND GOOD CHEMICAL REACTIVITY

(75) Inventors: Tze-Chiang Chung, State College, PA (US); Zhicheng Zhang, State College, PA (US); Shangtao Chen, State College, PA (US); Katsuyoshi Kubo, Mamaroneck, NY (US); Koji Kigawa, Rye, NY (US)

(73) Assignees: The Penn State Research Foundation, University Park, PA (US); Daikin America, Inc., Orangeburg, NY (US)

( * ) Notice: Subject to any disclaimer, the term of this patent is extended or adjusted under 35 U.S.C. 154(b) by 0 days.

(21) Appl. No.: 11/541,781

(22) Filed: Oct. 3, 2006

(65) Prior Publication Data

US 2008/0081195 A1 Apr. 3, 2008

(51) Int. Cl.
*B32B 27/00* (2006.01)
(52) U.S. Cl. .................. 428/421; 524/98; 524/195; 524/544; 524/545; 524/546; 526/245; 526/247; 526/249; 526/254; 526/255; 252/62.9 PZ; 252/519.34; 252/520.21
(58) Field of Classification Search .......... 526/255, 526/245, 247, 249, 254; 524/98, 195, 544–546; 252/62.9 PZ, 519.34, 520.21
See application file for complete search history.

(56) References Cited

U.S. PATENT DOCUMENTS

| 3,053,818 A | 9/1962 | Honn et al. |
| 3,461,155 A | 8/1969 | Rice |
| 3,790,540 A | 2/1974 | Dohany et al. |
| 4,158,678 A | 6/1979 | Tatemoto et al. |
| 4,361,678 A | 11/1982 | Tatemoto et al. |
| 4,554,335 A | 11/1985 | Sakagami et al. |
| 4,577,005 A | 3/1986 | Sako et al. |
| 5,087,679 A | 2/1992 | Inukai et al. |
| 5,928,791 A * | 7/1999 | Rosenmayer ............... 428/421 |
| 5,977,241 A * | 11/1999 | Koloski et al. ............. 524/502 |
| 6,235,433 B1 | 5/2001 | Amano et al. |
| 6,329,471 B1 | 12/2001 | Mizuide et al. |
| 6,355,749 B1 | 3/2002 | Chung et al. |
| 6,423,412 B1 | 7/2002 | Zhang et al. |
| 6,911,509 B1 * | 6/2005 | Chung et al. ................ 526/197 |
| 7,078,101 B1 | 7/2006 | Ramotowski et al. |

(Continued)

FOREIGN PATENT DOCUMENTS

WO    WO/02/083780    10/2002

OTHER PUBLICATIONS

Fox et al., Organic Chemistry, 1997, Jones and Bartlett Publishers, Inc., Second edition, p. 623.*

(Continued)

*Primary Examiner*—Mark Eashoo
*Assistant Examiner*—Nicole M Buie-Hatcher
(74) *Attorney, Agent, or Firm*—McDermott Will & Emery LLP

(57) ABSTRACT

Chain end functionalized fluoropolymers are disclosed exhibiting good chemical reactivity high breakdown electric field (E>100 MV/m) and high dielectric constants (i.e., ∈>10). The polymers can be prepared by functional initiators and from a variety of fluoromonomers including vinylidene difluoride together with one or more additional monomers. The polymers can be combined with other dielectric materials to form composites having uniform composition and morphology.

13 Claims, 4 Drawing Sheets

U.S. PATENT DOCUMENTS

2003/0139534 A1* 7/2003 Brothers et al. .......... 525/326.3
2006/0041090 A1* 2/2006 Chung et al. ................ 526/197

OTHER PUBLICATIONS

Zhang, et al., "Reaction Mechanism of Borane/Oxygen Radical Initiators during the Polymerization of Fluoromonomers," Macromolecules, 2006, pp. 5187-5189, 39, American Chemical Society.

Wang, et al., "High Dielectric VDF/TrFE/CTFE Terpolymers Prepared by Hydrogenation of VDF/CTFE Copolymers: Synthesis and Characterization," Macromolecules, 2006, pp. 4268-4271, 39, American Chemical Society.

International Search Report and Written Opinion of the International Searching Authority issued in International Application No. PCT/US2006/042473, dated on Jun. 1, 2007.

Keiko Koga et al., "Piezoelectricity and related properties of vinylidene fluoride and trifluoroethylene copolymers," J. Appl. Phys. 59 (6), Mar. 15, 1986, 1986 American Institute of Physics.

Higashihata et al., "Piezoelectricity of vinylidene fluoride-trifluoroethylene copolymers," *Ferroelectrics*, 1981, pp. 85-92, vol. 32, 1981 Gordon and Breach, Science Publishers, Inc., USA.

Tashiro et al., "Thermal Contraction and Ferroelectric Phase Transition in Vinylidene Fluoride-Trifluoroethylene Copolymers. 1. An Effect of Tensile Stress along the Chain Axis," *Macromolecules*, 1988, pp. 2463-2469, 21, 1988 American Chemical Society.

Tashiro et al., "Thermal Contraction and Ferroelectric Phase Transition in Vinylidene Fluoride-Trifluoroethylene Copolymers. 2. An Effect of Tensile Stress Applied in the Direction Perpendicular to the Chain Axis," *Macromolecules*, 1990, pp. 2802-2806, 23, 1990 American Chemical Society.

Chung et al., "Ferroelectric Polymers With Large Electrostriction; Based on Semicrystalline VDF/TrFE/CTFE Terpolymers," *Ferroelectrics Letters*, 2001, pp. 135-143, vol. 28(5-6), 2001 Taylor & Francis.

Daudin et al., "Effects of electron irradiation and annealing on ferroelectric vinylidene fluoride-trifluoroethylene copolymers," J. Appl. Phys. 62 (3), Aug. 1, 1987, 1987 American Institute of Physics.

Furukawa et al., "Electrostriction as the Origin of Piezoelectricity in Ferroelectric Polymers," Japanese Journal of Applied Physics, Apr. 1990, pp. 675-680, vol. 29, No. 4, The Institute of Physical and Chemical Research.

Yuki et al., "Effect of Hydrostatic Pressure on Dielectric Behavior and Phase Transition in Ferroelectric Polymers," 1998 Publication Board, Japanese Journal of Applied Physics, pp. 5372-5374, vol. 37, Pt. 1, No. 9B.

Ikeda et al., "Electrically Induced Ferroelectric Phase Transition of Copolymers of Vinylidene Fluoride and Trifluoroethylene," Jpn. J. Appl. Phys. vol. 31 (1992) pp. 1112-1117, Part 1, No. 4, Apr. 1992.

Xu et al. ,"High Dielectric Constant Composites Based on Metal-lophthalocyanine Oligomer and Poly (vinylidene fluoride-trifluoroethylene Copolymer," Journal of Applied Polymer Science, vol. 82, pp. 70-75 (2001), 2001 John Wiley and Sons, Inc.

Zhang et al., "An all-organic composite actuator material with a high dielectric constant," Nature, pp. 284-287, vol. 419, Sep. 19, 2002, 2002 Nature Publishing Group.

Wang et al., "Microstructure and Dielectric Properties of P(VDF-TrFE-CFE) with Partially Grafted Copper Phthalocyanine Oligomer," *Macromolecules* 2005, pp. 2247-2252, vol. 38, No. 6, 2005 American Chemical Society.

Chung et al., "Synthesis and Properties of Ferroelectric Fluoroterpolymers with Curie Transition at Ambient Temperature," *Macromolecules* 2002, pp. 7678-7684, vol. 35, No. 20, 2002 American Chemical Society.

Chung et al., "A Novel "Stable" Radical Initiator Based on the Oxidation Adducts of Alkyl-9-BBN," J. Am. Chem. Soc. 1996, pp. 705-706, vol. 118, No. 3, 1996 American Chemical Society.

Saint-Loup, "Synthesis and Properties of Novel Fluorotelechelic Macrodiols Containing Vinylidene Fluoride, Hexafluoropropene and Chlorotrifluoroethylene," *Macromolecules* 2002, pp. 1524-1536, vol. 35, No. 5, 2002 American Chemical Society.

International Preliminary Report on Patentability mailed Apr. 16, 2009 in PCT/US2006/042473.

* cited by examiner

CHAIN END FUNCTIONALIZED FLUOROPOLYMERS HAVING GOOD ELECTRICAL PROPERTIES AND GOOD CHEMICAL REACTIVITY

RELATED APPLICATIONS

This application may contain subject matter related to U.S. Pat. No. 6,355,749, entitled "Ferroelectric Polymers With Giant Electrostriction: Based On Semicrystalline Terpolymers Containing Vinylidene Difluoride, Trifluoroethylene and Third Monomer", U.S. Pat. No. 6,911,509, entitled "A New Process of Preparing Functional Fluoropolymers", and U.S. patent application Ser. No. 10/778,112, filed Feb. 17, 2004, each of which are hereby incorporated herein by reference.

FIELD OF THE DISCLOSURE

The present invention relates to chain end functionalized fluoropolymers that may exhibit good chemical reactivity, such as for crosslinking reaction and composite preparation, high breakdown electric field E>100 MV/m (megavolts per meter), high dielectric constant ($\in$>10), and high energy density. More particularly, the invention relates to fluoropolymers made from vinylidene difluoride (VDF) with one or more additional monomers, such as trifluoroethylene (TrFE), tetrafluoroethylene (TFE), chlorotrifluoroethylene (CTFE), chlorodifluoroethylene (CDFE), chlorofluoroethylene (CFE), hexafluoropropene (HFP), etc. which can be prepared by functional initiators. The resulting chain end functionalized fluoropolymers can advantageously have high dielectric and ferroelectric properties as well as good chemical reactivity.

BACKGROUND OF THE DISCLOSURE

Polymers that exhibit a high dielectric constant and generate a large electric displacement or/and mechanical actuation due to an external electric field have attracted a great deal of attention and have been used as capacitors, transducers, actuators and sensors. Currently, most of the commercial applications for high dielectric and ferroelectric materials are based on piezoceramics and magnetostrictive materials, despite the fact that they exhibit many deficiencies, such as low strain levels, brittleness, heavy weight, and high processing temperatures. Moreover, these materials exhibit processing difficulties when producing parts having complicated shapes. In contrast, ferroelectric polymers exhibit many desirable properties, such as flexibility, light weight, high mechanical strength, an ability to be processed readily into large area films, and an ability to be molded readily into a variety of configurations. Despite the advantages over ceramic materials, most polymers suffer the disadvantage of having a low electric field sensitivity, in terms of dielectric constant, electric displacement, piezoelectric coefficient, electromechanical coupling coefficient and field induced strain, which limit their applications.

In the past decade, most of the research activities involving high dielectric and ferroelectric polymers have focused on fluoropolymers, especially semicrystalline VDF/TrFE copolymers. Many research efforts have been devoted to a general goal of reducing the energy barrier for ferroelectric-paraelectric (Curie) phase transition, and for generating a large and fast electric-induced mechanical (piezoelectric) response at ambient temperature. Although VDF/TrFE copolymers (stretched film poled at 120° C.) exhibit a relatively high piezoelectric constant (Koga, et al. J. Appl. Phys., 59, 2142, 1986), the response of the dipoles to an electric field is very slow at ambient temperature, and the polarization hysteresis loop (polarity vs. electric field) of the copolymer is very large. A VDF/TrFE copolymer comprising 55 mole % VDF and 45 mole % TrFE, which exhibits the narrowest polarization hysteresis loop and lowest Curie temperature of the copolymers in the VDF/TrEF family (Higashihata, et al. Ferroelectrics, 32, 85, 1981), still exhibits a significantly wide hysteresis loop.

The connection between crystalline structure and electric properties led many to attempt to alter the copolymer morphology by creating non-equilibrium states; and a number of such attempts resulted in ferroelectric polymers that exhibit somewhat improved electric responses. Such attempts have included, for example, subjecting ferroelectric polymers to mechanical deformation (Tashiro, et al. Macromolecules, 21, 2463, 1988, and 23, 2802, 1990), electron-radiation (Daudin, et al. J. Appl. Phys., 62, 994, 1987; Zhang et al. U.S. Pat. No. 6,423,412), uniaxial drawing (Furukawa, et al. Japanese Journal of Applied Physics, 29, 675, 1990), crystallization under high pressure (Yuki, et al. Jpn. J. Appl. Phys., 37, 5372, 1998), and crystallization under high electric field (Ikeda, et al. Jpn. J. Appl. Phys., 31, 1112, 1992).

Chung et al. (U.S. Pat. No. 6,355,749, Ferroelectrics Letters 28, 135, 2001) showed an alternative method to change the crystalline domains and create relaxor ferroelectric behavior of VDF/TrFE copolymers by introducing a small amount (<10 mole %) of bulky ter-monomer units, such as chlorotrifluoroethylene (CTFE) units, into the copolymer with uniform molecular structure. The resulting terpolymers are completely solution and melt processable and form a desirable film morphology with uniform nano-crystalline domains that have Curie (polar-nonpolar crystalline phase) transition at about ambient temperature. The polarization hysteresis loop of the terpolymer also became very narrow. Therefore, these terpolymers exhibit very high dielectric constant ($\in$>70) at ambient temperature and fast and high electromechanical response (>5%) induced by external electric field.

Progress in terpolymers caused some researchers to investigate terpolymer composite materials (Nature 419, 284, 2002; J. Appl. Polym. Sci. 82, 70, 2001) with the objective to further enhance their dielectric properties, especially in two areas, (a) increasing the dielectric constant, so that a lower electric voltage is needed for large electromechanical response and (b) reducing dielectric loss during phase transition, which is a concern in device designs, especially for long term usages. The preparation of these composites was undertaken by simple blending of the terpolymer with some high dielectric materials, including copper phthalocyanine (CuCy) organic molecule (J. Appl. Polym. Sci. 82, 70, 2001, Nature 419, 284, 2002, Macromolecules 38, 2247, 2005). However, the low surface energy and non-stick properties of fluoropolymers result in the incompatible blends between fluoropolymers and high dielectric materials. The incompatibility is a major obstacle in preparing a uniform composite film (even>40 μm thickness) with good mechanical properties, which are essential for many electric applications. Overall, it is still elusive to prepare high performance dielectric materials.

Generally, methods of preparing fluoropolymers have been by free radical emulsion and suspension polymerization processes in aqueous solution using a batch reactor (F. J. Honn, et al. U.S. Pat. No. 3,053,818; J. E. Dohany, et al. U.S. Pat. No. 3,790,540; T. Sakagami, et al. U.S. Pat. No. 4,554,335; J. Sako, et al. U.S. Pat. No. 4,577,005; H. Inukai, et al. U.S. Pat. No. 5,087,679; H. Freimuth, et al. Polymer, 37, 831, 1996). The combination of heterogeneous reaction conditions, limited gas diffusion of the monomers in water, significant difference in comonomer reactivity ratios, and high monomer conversion in batch reactions inevitably results in co- and ter-polymers having a broad compositional distribution and inhomogeneous crystalline domains. In addition, it is also difficult to completely remove emulsifying and suspending agents (particularly those containing polar groups), after emulsion and suspension polymerization processes, respectively, which are detrimental to the resultant dielectric properties of the final product.

Chung (Macromolecules 35, 7678, 2002; 39, 5187, 2006; and 39, 4268, 2006) has also disclosed a method involving a solution or bulk polymerization process at ambient temperature using control radical initiators, such as organoborane/oxygen adducts, which form the co- and ter-polymers with narrow compositional and molecular weight distributions. The low temperature and relatively slow polymerization process also minimize the safety concerns, usually associated with bulk polymerization of fluoromonomers. This homogeneous polymerization has prepared co- and ter-polymers with narrow molecular weight and composition distributions and high purities, without the need for an emulsifying or suspending agents. Several control organoborane/oxygen radical initiators were discovered, which exhibited living radical polymerization characteristics, with a linear relationship between polymer molecular weight and monomer conversion to producing block copolymers by sequential monomer addition (Chung, et al. *J. Am. Chem. Soc.*, 118, 705, 1996).

While methods for preparing certain fluoropolymers having a high dielectric constant are known (see, e.g., U.S. Pat. No. 6,355,749), it is believed that certain fluoropolymers having high dielectric constants coupled with reactive functional groups that can provide good chemical reactivity have not been recognized. The interactive property provides the fluoropolymers with many advantageous features, including the incorporation of high dielectric organic/inorganic materials with uniform morphology to further enhance their dielectric and ferroelectric properties, the ability of forming a 3-D network that exhibits high mechanical strength, high breakdown voltage under extremely high external electric field conditions, and good adhesion to electrodes.

The chemistry for preparing chain end functionalized fluoropolymer is limited. A few examples of controlling chain end structure include the use of a functional initiator, which was reported by Rice and Sandberg at the 3M Company (see U.S. Pat. No. 3,461,155). They reported the preparation of low molecular weight VDF/HFP elastomers containing two ester terminal groups by using a diester peroxide initiator. The average functionality of the resulting telechelic VDF/HFP elastomer was not reported. However, it is logical to expect some difficulties in preparing a telechelic structure by using a free radical polymerization due to the fact that such techniques typically involve many side reactions in the termination step. Recently, Saint-Loup et al. (see Macromolecules, 35, 1542, 2002) also attempted to prepare chain end functionalized VDF/HFP elastomers containing two opposing hydroxy terminal groups by using hydrogen peroxide as an initiator. Several advantages of using hydrogen peroxide initiator include cost, high reactivity, and directly forming hydroxy terminal groups. However, many side reactions also occur in this polymerization, and the final product contains not only hydroxy terminal groups but also carboxylic acid terminal groups, as well as some unsaturated terminal groups.

A widely used method for preparing chain and functionalized fluoropolymers was developed by Daikin Corp. in the late 1970's and early 1980's (U.S. Pat. Nos. 4,158,678 and 4,361,678), which includes an iodine transfer polymerization (ITP) step to prepare fluoropolymers having two terminal iodine groups. The chemistry is based on the combination of a reversible addition-fragmentation chain transfer (RAFT) process and an α,ω-diiodoperfluoroalkane (I—$R_F$—I) chain transfer agent, where $R_F$ represents $CF_2CF_2$, $CF_2CF_2CF_2CF_2$, etc. The active $CF_2$—I groups are located at both ends of the polymer chain and maintain similar reactivity despite the growing polymer chain. The polymerization characteristics are usually demonstrated by an increase of molecular weight with conversion of monomer and relatively narrow molecular weight distribution (Mw/Mn<2). This reaction process has led to a commercial product, i.e. diiodo-terminated VDF/HFP elastomers with the trade name Dai-E1®, which is useful as a sealing material for O-ring, gaskets, tubes, valves and bellows, as well as useful in linings, protective gloves, and shoes.

SUMMARY OF THE DISCLOSURE

Advantages of the present invention include chain end functionalized fluoropolymers having good chemical reactivity and good electrical properties, their preparation and composites thereof.

Additional advantages, and other features of the present invention will be set forth in the description which follows and in part will become apparent to those having ordinary skill in the art upon examination of the following or may be learned from the practice of the present disclosure. The advantages may be realized and obtained as particularly pointed out in the appended claims.

According to the present invention, the foregoing and other advantages are achieved in part by a chain end functionalized fluoropolymer having Formula (I):

X—(Fluoropolymer)—Y     (I)

wherein, Fluoropolymer represents the polymerization product of vinylidine fluoride (VDF) and a second monomer selected from the group consisting of a fluoromonomer, a mixture of fluoromonomers, and a mixture of one or more fluoromonomers and one or more non-fluoromonomers, wherein the second monomer has from 2 to 15 carbon atoms; X and Y are independently the same or a different terminal group provided that at least one of X or Y is a functional terminal group. Advantageously, the chain end functionalized fluoropolymer has exhibits a breakdown electric field of more than about 100 MV/m, e.g. more than about 200 MV/m, a dielectric constant of at least 10, e.g., at least 15. Embodiments include wherein the fluoropolymer has an average molecular weight of between about 1,000 grams/mole and about 1,000,000 grams/mole, wherein the Fluoropolymer is the polymerization product of from about 50 to about 95 mole % vinylidene fluoride (VDF) and from about 5 to about 50 mole % of the second monomer, wherein the functional terminal group is selected from the groups consisting of $Si(R)_n(OH)_{3-n}$, $Si(R)_n(OR)_{3-n}$, OH, COOH, COOR, anhydride, ammonium, immidazolium, sulfonium, phosphonium ions, wherein n is from 0 to 2, and R is a $C_1$-$C_6$ alkyl group.

Another aspect of the present invention relates to a composite material comprising the chain end functionalized fluoropolymer. The composite material can include the chain end functionalized fluoropolymer, a second dielectric material, e.g., one having a dielectric constant of at least 50 and, optionally, a third fluoropolymer. Embodiments include composite materials having metal oxides such as BTO (barium-titanium-oxide) and PZT (lead-zirconate-titanate) ferroceramic materials, and organometallic copper phthalocyanine (CuCy) as the second dielectric material.

Another aspect of the present invention relates to a process for preparing the chain end functionalized fluoropolymer. The process includes combining an organoborane initiator having one or more functional groups with oxygen and the VDF and second monomer under conditions to polymerize the VDF and second monomer to form the chain end functionalized fluoropolymer having Formula (I).

Additional advantages of the present invention will become readily apparent to those skilled in this art from the following detailed description, wherein only the preferred embodiments of the present invention are shown and described, simply by way of illustration but not limitation. As will be realized, the invention is capable of other and different embodiments, and its several details are capable of modification in various obvious respects, all without departing from the spirit of the present invention. Accordingly, the drawings and description are to be regarded as illustrative in nature, and not as restrictive.

DETAILED DESCRIPTION OF THE DISCLOSURE

Figure 1A:
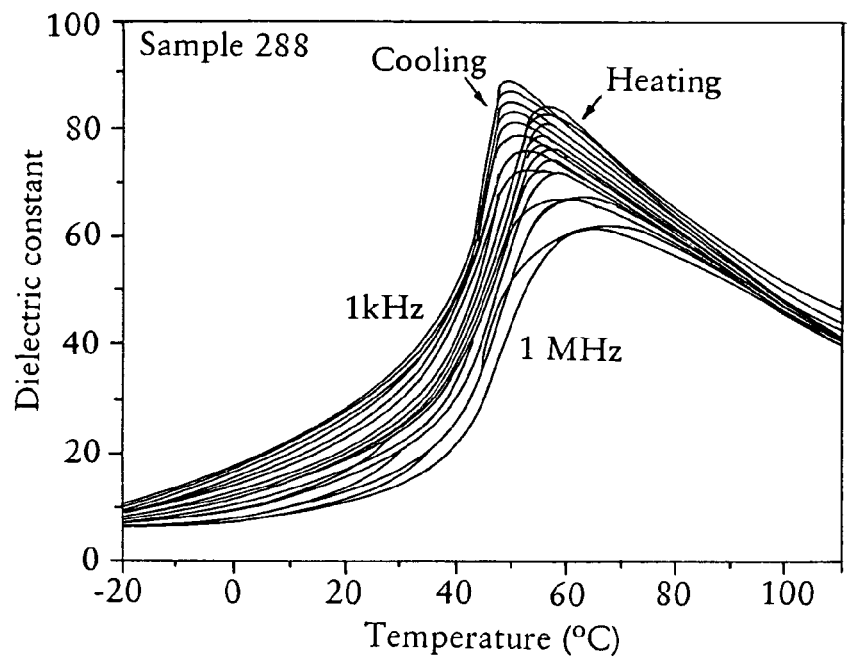
FIG. 1, (top) dielectric constants and (bottom) DSC curves of two silane group(s) terminated VDF/TrFE/CDFE polymers with 62/34/4 and 61/33/6 molar ratios.

This disclosure relates to a class of fluoropolymers containing functional groups that advantageously can have good chemical reactivity, high breakdown electric field (E>100 MV/m), a high dielectric constant ($\in$>10). The fluoropolymer can be used to prepare composite materials with a more uniform morphology than if the fluoropolymer without the functional groups were used. Preferably, the functional fluoropolymer is a "telechelic" fluoropolymer containing one or two reactive terminal functional groups (e.g., a polar end group) that not only provide reactive properties with high dielectric materials but also maintain the desirable properties of the fluoropolymer itself, due to the unperturbed polymer chain structure. As will be discussed, the terminal functional groups provide a chemical mechanism of forming a well-defined composite structure and can maintain a well-dispersed structure even under high electric field conditions. Furthermore, the functional groups can also facilitate formation of a crosslinked polymer network that increases the mechanical strength, breakdown electric field, and long term stability of materials made with the functional fluoropolymer.

In accordance with the present invention, chain end functionalized fluoropolymers can advantageously have good chemical reactivity, such as for crosslinking reaction and composite preparation, and can exhibit a breakdown electric field of more than about 100 MV/m, e.g. more than about 200 MV/m, and exhibit a high dielectric constant (e>10) at 1 kHz and 1 atmosphere. The dielectric constant can be measured at any temperature, including ambient temperature. As used herein, the term "ambient temperature" is understood to mean that the temperature is not controlled when measuring the dielectric constant but is made at room temperature, i.e., between about 20-25° C. Preferably, the chain end functionalized fluoropolymers have a dielectric constant at 1 kHz of at least 10 when measured at any temperature or when measured at a temperature between about 20° C. to about 100° C. In an embodiment of the present disclosure, the chain end functionalized fluoropolymers have a dielectric constant at 1 kHz of at least 10, 15, 20, 25, 30, 40, 50, 70, or any value there between when measured at any temperature. In another embodiment, the chain end functionalized fluoropolymers have a dielectric constant at 1 kHz of at least 10, 15, 20, 25, 30, 40, 50, 70, or any value there between when measured at any temperature between about 20° C. to about 100° C.

In an embodiment of the present disclosure, the functional fluoropolymer is represented by Formula (I):

X—(Fluoropolymer)—Y (I)

wherein, Fluoropolymer represents the polymerization product of vinylidine fluoride (VDF) and a second monomer selected from the group consisting of a fluoromonomer, a mixture of fluoromonomers, and a mixture of one or more fluoromonomers and one or more non-fluoromonomers, e.g. a substituted or non-fluorine substituted hydrocarbon monomer, wherein the second monomer has from 2 to 15 carbon atoms. X and Y are independently the same or a different terminal group provided that at least one of X or Y is a functional terminal group (i.e., an end group generally susceptible to chemical reactions). The chain end functionalized fluoropolymer has a dielectric constant at 1 kHz of at least 10, 15, 20, 25, 30, 40, 50, 70, or any value there between. Preferred fluoromonomers are selected from trifluoroethylene (TrFE), tetrafluoroethylene (TFE), hexafluoropropene (HFP), 1-chloro-1-fluoro-ethylene(1,1-CFE),1-chloro-2-fluoro-ethylene(1,2-CFE),1-chloro-2,2-difluoroethylene (CDFE), chlorotrifluoroethylene (CTFE), trifluorovinyl functional monomers, such as 1,1,2-trifluorobutene-4-bromo-1-butene and 1,1,2-trifluorobutene-4-silane-1-butene, perfluoroalkyl vinyl ethers, such as perfluoromethyl vinyl ether (PMVE) and perfluoropropyl vinyl ether (PPVE), and perfluoro acrylates and methacrylates, such as 2,2,2-trifluoroethyl acrylate and 2-(perfluorohexyl)ethyl acrylate. The preferred non-fluoromonomers, e.g., e.g. a substituted or non-fluorine substituted hydrocarbon monomers are selected from vinyl chloride, vinyl ether, acrylates and methacrylates. X or Y can be any terminal group including an H. As functional groups, X or Y can be any functional terminal group such as $Si(R)_n(OH)_{3-n}$, $Si(R)_n(OR)_{3-n}$, OH, COOH, COOR, anhydride, ammonium, immidazolium, sulfonium, phosphonium ions, etc. wherein n is from 0 to 2, and R is a $C_1$-$C_6$ alkyl group. In an embodiment, both X and Y are functional terminal groups. In one aspect of the disclosure, the chain end functionalized fluoropolymer has a number average molecular weight (Mn) between about 1,000 grams/mole and about 1,000,000 grams/mole, and preferably between about 5,000 and about 300,000, and more preferably between about 10,000 and about 200,000 grams/mole.

Other embodiments of the chain end functionalized fluoropolymers include wherein the Fluoropolymer represents the polymerization product of (a) from about 30, 40 or 50 mole % to about 95 mole % of VDF, (b) from about 5 to about 30, 40 or 50 mole % of the second monomer, e.g. TrFE and, optionally (c) from about 1 to about 10 or 20 mole % of at least one ter-monomer. The ter-monomer can be selected from of the monomers previously listed and preferably includes CTFE, 1,1-CFE, 1,2-CFE, CDFE, HFP, trifluorovinyl functional monomers, such as 1,1,2-trifluorobutene-4-bromo-1-butene and 1,1,2-trifluorobutene-4-silane-1-butene, perfluoroalkyl vinyl ethers, such as PMVE, PPVE, perfluoro acrylates and methacrylates, 2,2,2-trifluoroethyl acrylate, 2-(perfluorohexyl)ethyl acrylate, and mixtures thereof. In an embodiment of the disclosure, Fluoropolymer represents the polymerization product of VDF with one or more of TrFE, CTFE and/or HFP.

Chain end functionalized fluoropolymers can be prepared by applying a functional free radical initiator that can form the initiation fragment containing one or more functional groups. The functional group carrying fragment initiates the polymerization and forms the functional group in the beginning of polymer chain. As discussed, there are some reported functional free radical initiators in the art (U.S. Pat. No. 3,461,155, Macromolecules, 35, 1542, 2002). However, the regular free radical polymerization is known to undergo many uncontrollable chain transfer reactions that in situ form new (but unfunctionalized) initiators that produce the polymers without a terminal functional group. In other words, the resulting polymers are a mixture with various chain end structures, with and without functional groups.

It is particularly advantageous to use a process by applying control radical initiator containing functional group(s), which exhibits low chain transfer reaction during the polymerization. Such a process provides at least one functional group incorporated in the beginning of each polymer chain. In addition, the control radical polymerization also provides control over the termination reaction, which offers the possibility to control the other polymer chain end structure, including the incorporation of other functional group(s), and also the final polymer structure. A control coupling reaction between two propagating chain end radicals can form telechelic polymer structures with functional groups at both polymer chain ends. With the use of a star-branching agent having multiple coupling sites, a star-shape (multiple arms) polymer structure can also be formed with each arm containing a terminal functional group.

One suitable control radical polymerization process is the iodine transfer polymerization (ITP) method (U.S. Pat. Nos. 4,158,678 and 4,361,678). This polymerization mechanism, involving an α,ω-diiodoperfluoroalkane chain transfer agent and a reversible addition-fragmentation chain transfer (RAFT), maintains a $CF_2$—I group at both propagating chain ends and leads to the diiodo-terminated fluoropolymer structure (II). The terminal iodo groups in the fluoropolymer can be further converted to other reactive functional groups, as shown in Equation 1. Under free radical conditions with the presence of maleic anhydride, the chain end radicals formed react with maleic anhydride by mono-enchainment to form succinic anhydride terminated polymer (III), which has light brown color. On the other hand, a simple reaction between diiodo-terminated fluoropolymer and imidazole produces the corresponding imidazolium ion terminated fluoropolymer (IV) with light yellow color. Both reactions are effective, without showing significant side reactions, such as crosslinking or degradation.

Equation 1

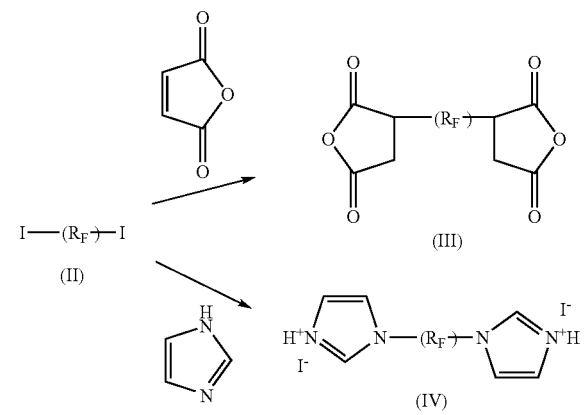

Another control radical polymerization can be used to prepare chain end functionalized fluoropolymers. As illustrated in Equation 2, the chemistry involves a functional organoborane/oxygen initiator that can carry out control radical polymerization of fluoromonomers and introduce a fragment of the initiator containing functional group(s) at the beginning of the fluoropolymer chain.

Equation 2

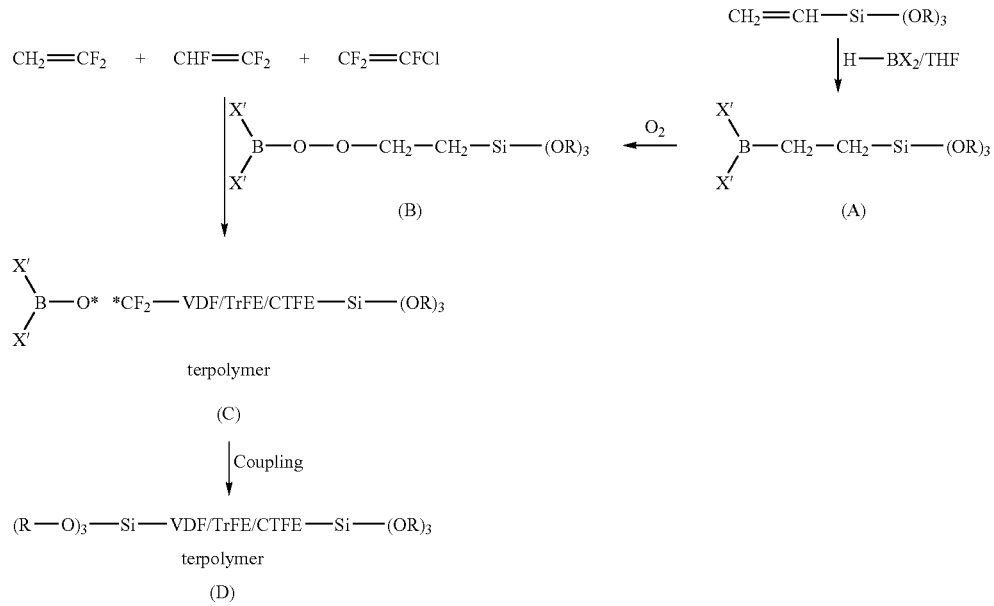

Wherein, organoborane (A) includes symmetric and asymmetric structures. When symmetric $X^1$ and $X'$ are the same and can include the ethyltriakloxylsilane ligand. When asymmetric $X^1$ and $X'$ act as a blocking group to direct the oxygen oxidation to the ethyltriakloxylsilane ligand. R is selected from linear, branched, or cyclic alkyl groups having a carbon number from 1 to about 6, preferably from 1 to 4, and most preferably from 1 to 2. The functional borane initiator (A), containing a silane group, was prepared by simple hydroboration reaction of vinylsilane (commercial available) with a borane compound containing at least one B—H group. The hydroboration reaction is almost quantitative at ambient temperature. The subsequent mono-oxidation reaction of functional borane initiator (A) with a controlled quantity of oxygen spontaneously occurred at room temperature to form the corresponding peroxylborane (B) containing a reactive B—O—O—C moiety for initiating polymerization. This oxidation reaction can be carried out in situ during the polymerization with the presence of monomers. Without being bound by any theory, it is believed that in the presence of suitable monomers, the B—O—O—C species (B) that is formed further decomposes at ambient temperature to an alkoxyl radical (C—O*) by hemolytic cleavage of the peroxide bond or to an alkyl radical (C*) by intermolecular reaction between B—O—O—C and B—C bonds. In both reactions, a borinate radical (B—O*) is also formed during the formation of C—O* or C* radical. The alkyl and alkoxyl radicals are active in initiating polymerization of monomers. On the other hand, the borinate radical (B—O*) is believed too stable to initiate polymerization due to the back-donating of electrons to the empty p-orbital of boron. However, this "dormant" borinate radical may form a reversible bond with the radical at the growing chain end to prolong the lifetime of the propagating radical. The resulting fluoropolymers (C) has a terminal silane group at the beginning of polymer chain, and the polymer molecular weight is controlled by monomer concentration and reaction time. Under some reaction conditions, especially at high reaction temperatures, the termination by coupling reaction is enhanced, and the resulting polymer (D) contains two terminal silane groups at the beginning and at the end of the polymer chain. Furthermore, a star-branching agent, containing multiple reaction sites with the propagating radicals, can be added at the end of polymerization to form a star-shape (multiple arms) polymer with each arm containing a terminal functional group.

The specific acid-base interaction between boron in initiator and fluorine in monomer significantly enhances the addition reaction of fluoromonomer to the propagating site. Departing from many free radical polymerization systems, this borane-mediated radical polymerization can take place at ambient temperature to incorporate a broad range of fluoromonomers, including vinyl fluoride (VF), vinylidine fluoride (VDF), trifluoroethylene (TrFE), tetrafluoroethylene (TFE), hexafluoropropene (HFP), 1-chloro-1-fluoro-ethylene(1,1-CFE),1-chloro-2-fluoro-ethylene(1,2-CFE),1-chloro-2,2-difluoroethylene (CDFE), chlorotrifluoroethylene (CTFE), perfluoroalkyl vinyl ethers, perfluoro acrylates and methacrylates, perfluorovinyl functional monomers, such as 1,1,2-trifluorobutene-4-bromo-1-butene and 1,1,2-trifluorobutene-4-silane-1-butene, and their mixtures.

In addition to random co- and ter-polymers, it is also possible to extend the functional borane-mediated control radical polymerization to block copolymers by means of sequential monomer addition. In other words, after completing the polymerization of one or more monomers to the extent desired to form a first polymer "block", a second or set of monomers is introduced into the reaction mass to form a second polymer "block" that is attached to the end of the first block. The combination of monomers include a fluoromonomer, a mixture of fluoromonomers, or a mixture of one or more fluoromonomer and non-fluoromonomer, in which the monomers have from 2 to 15 carbon atoms. After terminating the living polymerization, the partially oxidized borane residue located at the beginning of polymer chain can be completely interconverted to a reactive functional end group. Using this sequential addition process, a broad range of diblock, triblock, etc. copolymers can be prepared, which contain reactive terminal functional group(s) at the same polymer chain end.

Figure 1A:
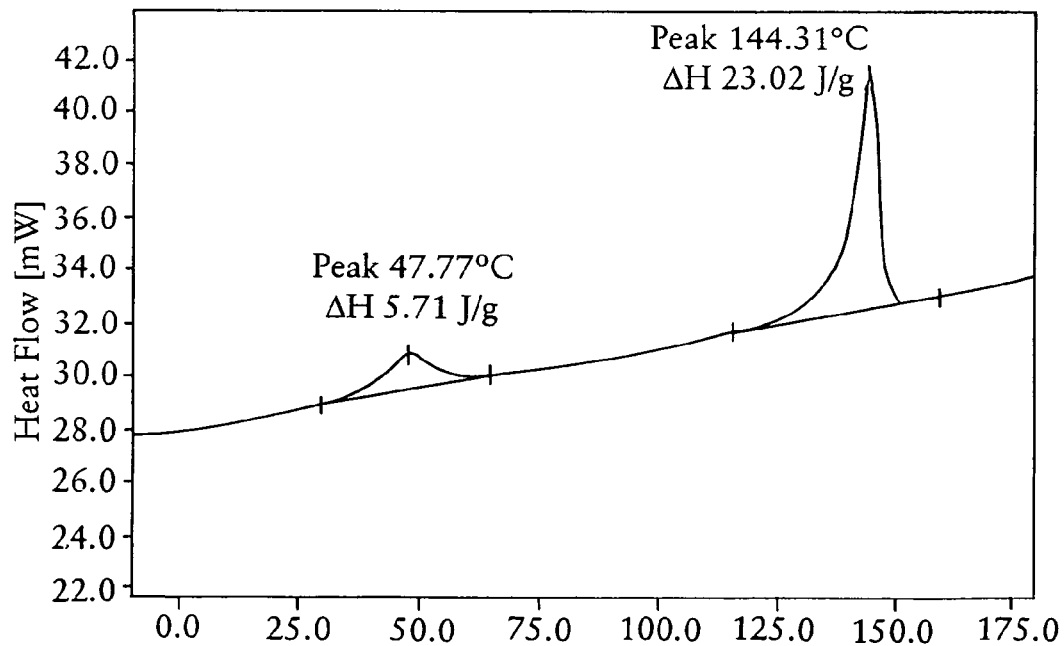
Figure 1B:
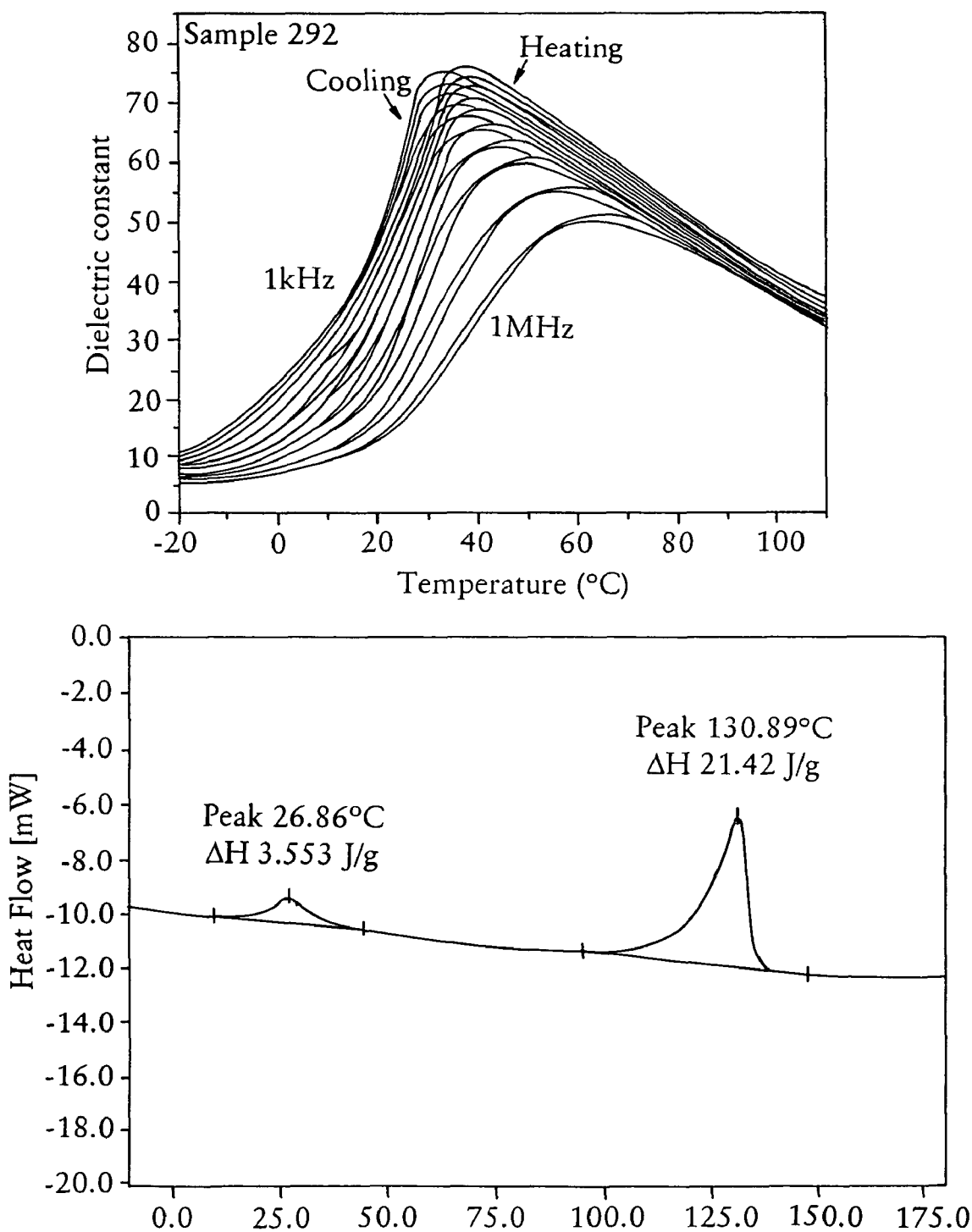

Advantageously the functional fluoropolymer can exhibit similar physical properties, especially dielectric and ferroelectric properties, as the corresponding fluoropolymer without terminal functional groups. As shown in FIG. 1, two silane-terminated VDF/TrFE/CDFE terpolymers prepared with a borane initiator having a silane group were examined by DSC and dielectric constants during the heating-cooling cycles. Apparently, the terminal silane group did not affect the terpolymer properties. Desirable properties, such as high dielectric constant and ambient Curie temperature, can be obtained in the chain-end functionalized terpolymer, which are basically governed by the main chain of the terpolymer.

The functional groups in the chain end functionalized fluoropolymers afford the formation of a crosslinked fluoropolymer network structure. Such materials are expected to have an increase in mechanical strength and electric stability, even under extremely high external electric field, up to 300 MV/m (megavolts per meter). Furthermore, the functional groups allow the incorporation of other materials, including dielectric organic or inorganic molecules or particles having very high dielectric constant ($\in$>50 at 1 kHz) to further increase the overall dielectric and ferroelectric properties. In other words, the functional fluoropolymer provides the mechanism of forming uniform composite structures and can maintain a well-dispersed structure even under high electric field conditions. The composites can be prepared by simply mixing the functionalize fluoropolymer with another material. It is understood that the mixing process can include chemical reactions and physical blending with or without additives, such as stabilizer, glass fibers, carbon black, etc. Furthermore, the process can also include mixed solution and melt blending steps. The composition of the functional fluoropolymer composites can be binary or ternary blends. The binary blend compositions include, for example, (a) about 60 to 99 parts by weight of the functional fluoropolymer illustrated in Formula (I) and (b) from about 1 to 40 parts by weight of high dielectric organic or inorganic material. The ternary blend compositions include, for example, (a) from about 1 to 50 parts by weight of the functional fluoropolymer illustrated in Formula (I), (b) from about 50 to 95 parts by weight of a second fluoropolymer, e.g., a corresponding fluoropolymer (without functional groups), that is compatible with the chain end functionalized fluoropolymer (I), and (c) from about 1 to 40 parts by weight of high dielectric organic or inorganic material.

Figure 2:
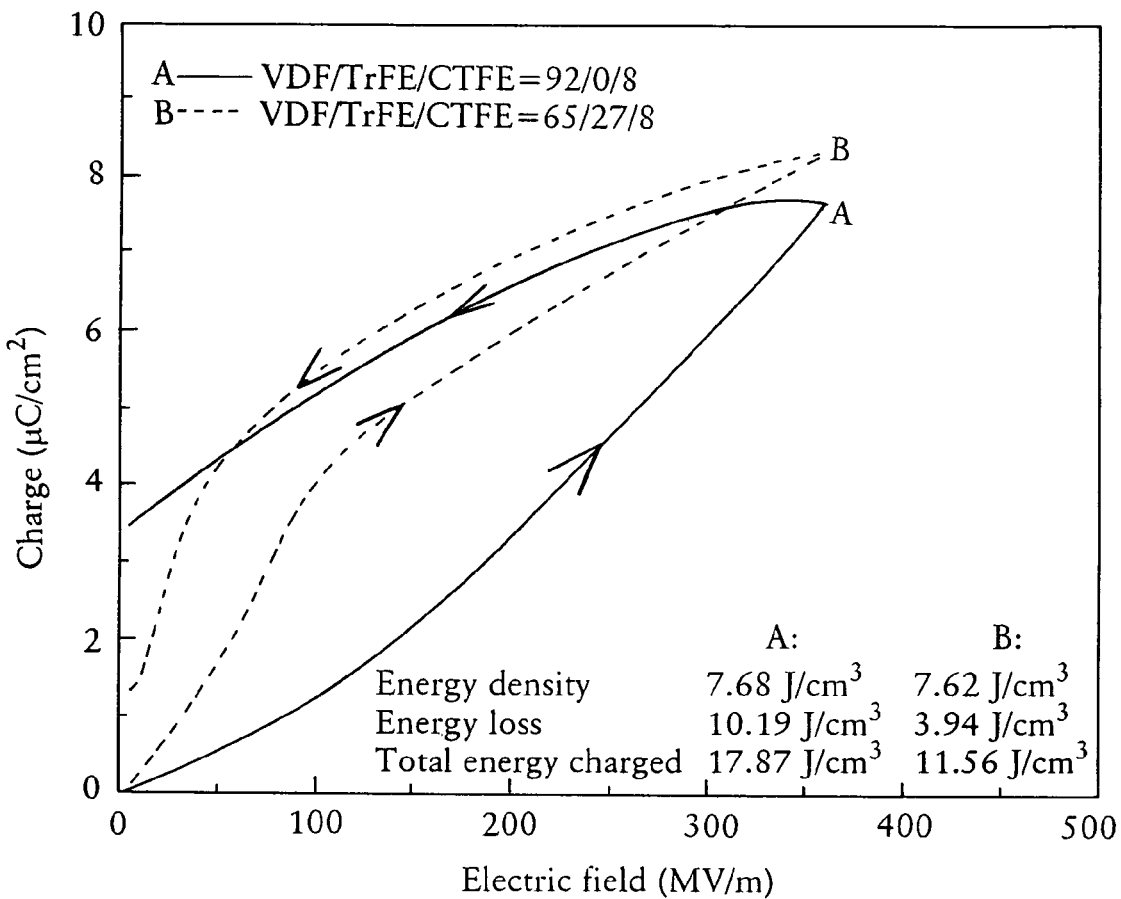
FIG. 2, P-E (polarization vs. electric field) curves of two silane group(s) terminated VDF/CTFE and VDF/TrFE/CTFE polymers with 92/8 and 65/27/8 molar ratios; the inset compares total energy charged during the charging cycle to 350 MV/m and energy density and energy loss during the discharge cycle for two polymers, respectively.

One major advantage of the fluoropolymer (I) having terminal functional group(s) in one or both end of polymer chain is that they can exhibit high chemical reactivity. These reactive terminal functional groups have good mobility and can effectively carry out specific coupling reactions. One example is cross-linking reaction. By simple heating, the terminal silane groups in telechelic polymer (D) in Equation 2 form a stable 3-D network with a relatively well-defined structure. In addition to the pre-determined cross-linking density by telechelic polymer molecular weight, the cross-linking reaction can occur in situ during a thin film forming process. Some of the resulting VDF co- and ter-polymer thin films show extremely high breakdown electric field with high capacitance. FIG. 2 compares the P-E (polarization vs. electric field) curves of two silane group terminated VDF/CTFE and VDF/TrFE/CTFE polymers with 92/8 and 65/27/8 molar ratios, both contain 8 mole % of CTFE units and measured under an unipolar electric field (350 MV/m) with charge-discharge (polarization-depolarization) cycles. The VDF/CTFE copolymer with 92/8 mole ratio is an optimum composition in this class of copolymers, showing large capacitance (7.6 μC/cm$^2$ at 350 MV/m) and high breakdown electric field (>350 MV/m). On the other hand, the VDF/TrFE/CTFE terpolymers with 65/27/8 molar ratio shows higher capacitance (8.4 μC/cm$^2$ at 350 MV/m) and a slim hysteresis loop during charging-discharging cycles, reconfirming relaxor ferroelectric behavior in the terpolymer. The energy storage in the polymer can be calculated from the P-E curve, which is equal to the integration area of electric field and polarization charge. The results are summarized in the insert table. In the charging cycle, the copolymer shows higher total charged energy (17.87 J/cm$^3$), and 11.56 J/cm$^3$ for the terpolymer at 350 MV/m. However, in the discharging cycle the terpolymer shows a smaller energy loss 3.94 J/cm$^3$ (vs. 10.19 J/cm$^3$ for the copolymer) and a similar energy density (7.6 J/cm$^3$). The reduced energy loss is a consideration for many device designs and applications.

Furthermore, the reactive terminal function groups can carry out coupling reaction with some high dielectric organic or inorganic molecules a high dielectric constant. In other words, the resulting composite material can be very uniform in morphology, with an almost molecular-scale dispersion of high dielectric molecules in a fluoropolymer matrix. This single phase polymer or nanocomposite material simultaneously improves several dielectric and ferroelectric properties, such as higher dielectric constant, lower dielectric loss, higher break down electric field, and better thin-film forming capability. The new composite materials can exhibit robotic performance for long period time with large electromechanical response and ultrahigh energy density under high electric field.

In the preparation of a composite material, multiple components that are compatible or/and reactive with the functional fluoropolymer (I) can be used. For example, a binary blend composition includes (a) from about 60 to 99 parts by weight of the functional fluoropolymer (I) and (b) from about 1 to 40 parts by weight of high dielectric organic or inorganic material. Examples of high dielectric materials that can be used to prepare the composites include piezoelectric materials such as metal oxides, e.g., BTO and PZT. A ternary blend composition can include (a) from about 1 to 50 parts by weight of the functional fluoropolymer (I), (b) from about 50 to 95 parts by weight of the corresponding fluoropolymer (without terminal functional groups), that is compatible with the chain end functionalized fluoropolymer (I), and (c) from about 1 to 40 parts by weight of high dielectric organic or inorganic material preferably having a dielectric constant (∈>50) at 1 kHz.

Several known high dielectric materials, including BTO and PZT ceramic nono-particles and copper phthalocyanine (CuCy) organic molecule, were used in the formation of uniform composite materials. The CuCy molecules were attracted considerable attention in the 80's. Some experimental results showed improved electric properties including an especially high dielectric constant (∈>10$^5$) was observed at elevated temperature. The unique electrical properties are believed to be the consequence of highly π-electron delocalization in the multiple phthalocyanine macrocyclic structure. In addition, the multiple COOH groups located around the edge of macrocycles provide the reactive sites for coupling with chain end functional fluoropolymer that contains a corresponding reactive terminal group (such as OH and NH$_2$). As shown in Equation 3, the coupling reaction between an OH group terminated fluoropolymers and CuCy molecules forms a star-branched polymer structure with molecular-scale dispersion of CuCy molecules in the fluoropolymer matrix.

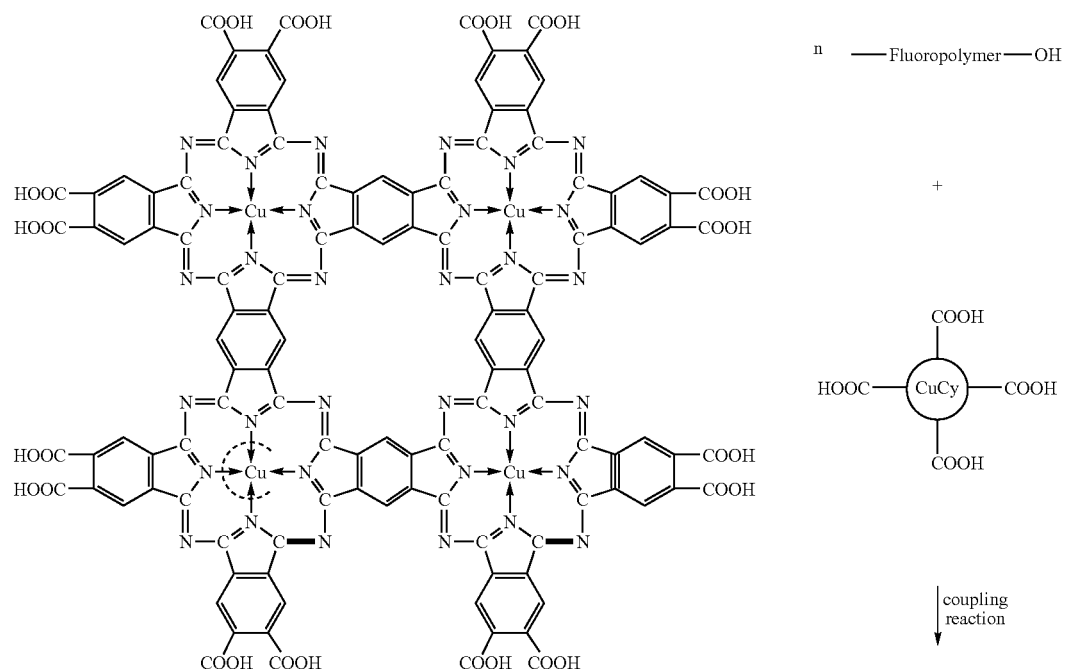

Equation 3

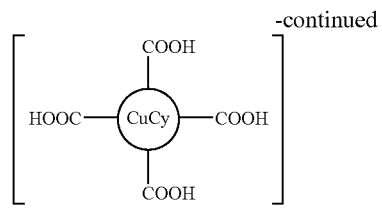 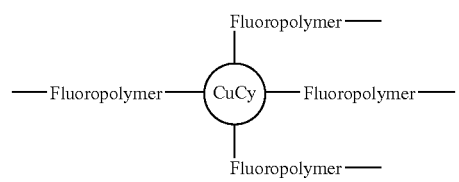

The symbol "Fluoropolymer" represents the same polymer described above. In this example, the fluoropolymer has a terminal OH group.

Figure 3:
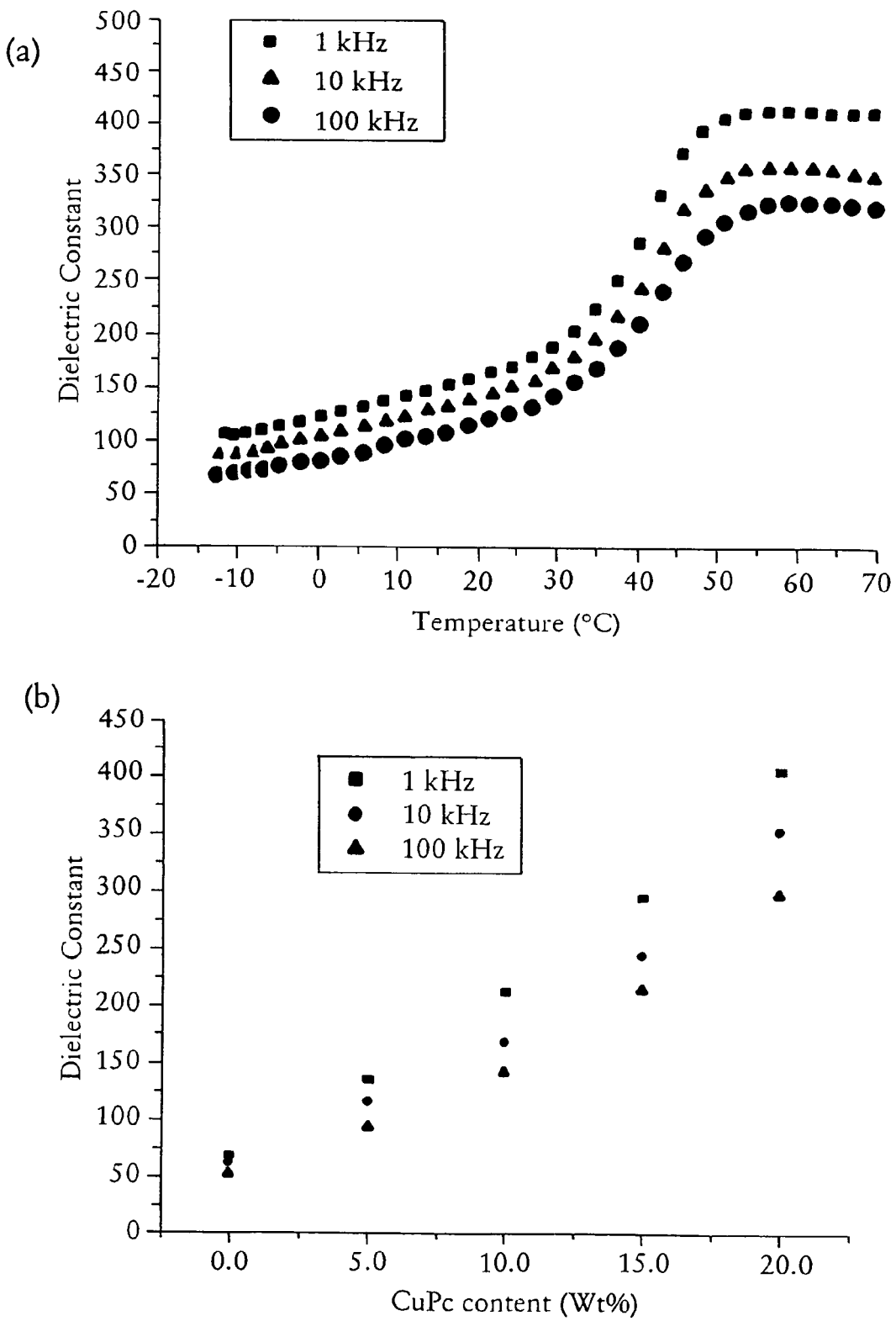
FIG. 3, (a) Dielectric constant of a fluoropolymer/CuCy composite material with 80/20 weight ratio between an OH terminated VDF/TrFE/CTFE (59/34/7 molar ratio) terpolymer with Mn of about 15,000 g/mole; (b) the plots of dielectric constant vs. CuCy content under various frequency.

The resulting star-branched polymer structure can exhibit good shear thinning and high melt strength and can be formed into a uniform polymer thin film. It is expected to have a biaxial orientation (due to 2-D structure) and to form substantially defect-free ultra thin films (thickness<about 5 μm). As shown in FIG. 3, the dielectric constant of an uniform and strong composite film, containing 80/20 weight ratio between (a) an OH terminated VDF/TrFE/CTFE (59/34/7 molar ratio) terpolymer with a number average molecular weight of about 15,000 g/mole and (b) CuCy oligomers having exceptionally high dielectric constant (∈>50,000), reaches above 400 with 1 kHz and 300 with 100 kHz at 50° C. The overall dielectric constant of this material increases systematically between 1-100 kHz with an increase in the content of high dielectric CuCy molecules. Even, the content is well-below the percolation threshold (volume fraction>35%) that is usually required in a two phase inorganic/polymer composite to increase the dielectric constant. In this apparent single-phase material, it appears that all constituent units along the polymer chain seem to linearly contribute to the dielectric constant of the material. In addition, this film shows very low dielectric loss and high break down voltage. It is believed to have a single phase with a molecular-scale dispersion of the CuCy molecules.

The following examples are illustrative of the principles and practice of embodiments to the present invention, and are not limiting in nature. Those skilled in the art will recognize, or be able to ascertain, using no more than routine experimentation, numerous equivalents to the specific substances and procedures described herein.

EXAMPLE 1

Synthesis of $((C_2H_5O_3)SiCH_2CH_2)_3$ Functional Initiator

In a 500 ml dry flask, equipped with a magnetic stir bar, 250 ml of dry THF and 35 g (180 mmol) of vinyltriethoxylsilane was injected. After cooling the solution to 0° C., 60 ml of $BH_3$ in THF (1.0 M) was added. The mixture was stirred at 0° C. for 4 hours and then was warmed to ambient temperature for 1 hour to assure complete hydroboration reaction. After solvent-removal, the product was subjected to vacuum distillation at 170° C. to obtain 31.4 g of $((C_2H_5O)_3SiCH_2CH_2)_3B$ functional initiator.

EXAMPLE 2

Synthesis of $(Cl_3SiCH_2CH_2CH_2)_3B$ Functional Initiator

The $(Cl_3SiCH_2CH_2CH_2)_3B$ functional initiator was prepared by hydroboration of allyltrichlorosilane with boron hydride (3:1 mole ratio). Hydroboration reaction was conducted at 0° C. for 4 hours in tetrahydrofuran (THF). In a typical example, the reaction was carried out in dried flask containing 20 ml dried THF and 8.7 ml (0.06 mol) allyltrichlorosilane. The solution was then cooled down to 0° C., and 20 ml (0.02 mol) of 0.1 M boron hydride in THF was then dropped slowly via the air-tight syringe into the reaction flask. The solution was stirred at 0° C. for 4 h. After that the THF was removed under high vacuum pump to obtain about 82% yield tri(trichlorosilyl propyl)borane initiator.

EXAMPLE 3

Synthesis of $(CH_3Cl_2SiCH_2CH_2CH_2)_3B$ Functional Initiator

Following similar procedure described in Example 2, $(CH_3Cl_2SiCH_2CH_2CH_2)_3B$ functional initiator was prepared by hydroboration of allydichlorolmethylsilane with boron hydride (3:1 mole ratio). Hydroboration reaction was conducted at 0° C. for 4 hours in tetrahydrofuran (THF). After THF removal under high vacuum, the $(CH_3Cl_2SiCH_2CH_2CH_2)_3B$ functional initiator was obtained with 87% yield.

EXAMPLE 4

Synthesis of $((CH_3)_2ClSiCH_2CH_2CH_2)_3B$ Functional Initiator

Following similar procedure described in Example 2, $((CH_3)_2ClSiCH_2CH_2CH_2)_3B$ functional initiator was prepared by hydroboration of allychloroldimethylsilane with boron hydride (3:1 mole ratio). Hydroboration reaction was conducted at 0° C. for 4 hours in tetrahydrofuran (THF). After THF removal under high vacuum, the $(CH_3Cl_2SiCH_2CH_2CH_2)_3B$ functional initiator was obtained with 90% yield.

EXAMPLE 5

Synthesis of $(C_2H_5OOCCH_2CH_2CH_2)_3B$ Functional Initiator

Following similar procedure described in Example 2, the $(C_2H_5OOCCH_2CH_2CH_2)_3B$ functional initiator was prepared by hydroboration of allylacetate with boron hydride (3:1 mole ratio). Hydroboration reaction was conducted at 0° C. for 4 hours in tetrahydrofuran (THF). After THF removal under high vacuum, the $(C_2H_5OOCCH_2CH_2CH_2)_3B$ functional initiator was obtained with 85% yield.

EXAMPLE 6

Synthesis of Functional Peroxide Initiators

In a typical example, a mixture of 6 g sodium chloride in 25 ml water was cooled down to 0° C. before slowly adding 0.28 g (3.6 mmol) sodium peroxide. After completing the addition, the solution was cooled down to −25° C. and stirred vigorously. Trichloroacetyl chloride 0.9 g (5 mmol) was added slowly by syringe within 1 min and stirred at −25° C. for 5 min. The solution was then extracted with 15 ml chloroform (or with ether in the cases of allyl chloroformate and 2-bromo-ethylchloroformate). The catalyst solution was then dried under high vacuum to get about 80% yield of white solid peroxide product and was ready to use for the polymerization.

EXAMPLE 7

Synthesis of $CF_2$=$CFCH_2CH_2OH$ Functional Monomer

In a round-bottomed flask equipped with a condenser and a magnet stirrer, 3.0 g (125 mmol) of magnesium powder was introduced. The flask was flame-dried under vacuum for about 30 min and recharged with argon before adding 200 ml of absolutely dried diethyl ether. Then 19.0 g (100.5 mmol) of $CF_2$=$CFCH_2CH_2Br$ (BTFB) was added in two steps. Under vigorous stirring, the first fraction 3.0 g of BTFB was injected into the flask. The exothermic reaction causes solvent refluxing. After 5 minutes, the rest of BTFB was added dropwise to keep the solvent refluxing. After completing the BTFB addition, the solution was continuously stirred for another 2 hours before filtrating out the solids to obtain a clear light yellow $CF_2$=$CFCH_2CH_2MgBr$/ether solution. This clear light yellow solution was then cooled down to 0° C., when 1.3 liter (54 mmol) of $O_2$ was slowly introduced into the solution for about 30 min. After another 30 min of stirring, 120 ml of 1M $HCl/H_2O$ was added. The mixture was stirred for another 30 min, and then the water layer was removed. The organic layer washed with 50 ml of brine 3 times, then dried by $MgSO_4$. After removing $MgSO_4$ by filtration and the ether by distillation under normal pressure at 80° C., the raw product was fractionally distilled under normal pressure. The final product was collected as a colorless clear liquid by fractional distillation between 110° C. and 115° C. was the final product 8.2 g of $CF_2$=$CFCH_2CH_2OH$, with an overall 67% yield.

EXAMPLE 8

Synthesis of $CF_2$=$CFCH_2CH_2OSi(CH_3)_3$ Functional Monomer

Following the procedure in Example 7, a clear light yellow $CF_2$=$CFCH_2CH_2MgBr$/ether solution was prepared by reacting 3.0 g of Mg with 19.0 g of BTFB in 300 ml diethyl ether. This solution was then added with 7.0 g (41 mmol) of N,N,N',N',N''-pentamethyl-diethylenetriamine (PMDETA). Under vigorous stirring, 11 g (10.2 mmol) of $(CH_3)_3SiCl$ was added dropwise into the mixture for a period of about 20 min. Stirring was continued for 30 min the resulting slurry was filtered and washed with 100 ml ether for 3 times. The combined filtrate was concentrated by removing ether via distillation at 70° C. under normal pressure, then the trace of remaining ether and excess $Me_3SiCl$ was completely removed under vacuum (0.5 mmHg) at 0° C. The pure product (12.2 g) was distilled at 120° C.~125° C., with 61% yield.

EXAMPLE 9

Synthesis of $CF_2$=$CFCH_2CH_2Si(CH_3)_2H$ Functional Monomer

Following the same procedure described in Example 7, a clear light yellow $CF_2$=$CFCH_2CH_2MgBr$/ether solution was prepared by reacting 4.2 g (175.0 mmol) of Mg with 29.0 g (150.2 mmol) of BTFB in 300 ml diethyl ether. After cooling the solution down to 0° C., 14.1 g (150 mmol) of $(CH_3)_2SiHCl$ was added. The mixture was slowly warmed to room temperature within 2 hours stirring for an additional 2 hours. The mixture was then cooled to −40° C. in order to let the solid fully separated from the solution. The ether layer was then decanted from the residue. After distilling the ether from the solution at 70° C., the colorless liquid product of $CF_2$=$CFCH_2CH_2Si(CH_3)_2H$ (17.2 g) was distilled out at higher temperature, with 60% yield.

EXAMPLE 10

Synthesis of VDF/TrFE Copolymers Containing Terminal $(C_3H_5O)_3SiCH_2CH_2$— Groups The polymerization was carried out in a Parr high pressure reactor (75 ml) equipped with a magnetic stir bar. About 0.3 g of $((C_2H_5O)_3SiCH_2CH_2)_3B$ initiator (obtained from Example 1) was added into the reactor under the argon atmosphere. The autoclave was then vacuumed and cooled from outside by liquid nitrogen and 18 g of vinylidene fluoride (VDF), 12 g of trifluoroethylene (TrFE) were distilled into the autoclave. After the monomers and tributylborane had been added to the autoclave, $0.025 \times 10^{-3}$ moles of oxygen was introduced into the autoclave and the autoclave was warmed to ambient temperature. The bulk polymerization was continued at ambient temperature for 5 hours before vacuum-distilling any unreacted monomers. The resulting chain end functional copolymer (10.2 g) was recovered, washed with methanol, and dried. According to chlorine analysis and $^1H$ NMR measurements, the terpolymer contains terminal $(C_2H_5O)_3SiCH_2CH_2$ group with a composition comprised 65.8 mole % VDF, 34.2 mole % TrFE. The copolymer had a peak melting temperature of 143° C. and Curie temperature of 68° C., based on DSC measurements.

EXAMPLES 11-14

Synthesis of VDF/HFP Copolymers Containing Terminal $(C_2H_5O)_3SiCH_2CH_2$— Groups A series of $(C_2H_5O)_3Si$ Group terminated VDF/HFP copolymers were prepared by using $((C_2H_5O)_3SiCH_2CH_2)_3B$ functional initiator (obtained from Example 1). Table 1 summarizes the experimental conditions and results. All polymerization reactions were carried out in a Parr high pressure reactor (200 ml) equipped with a magnetic stir bar. In a typical reaction, 4.6 g of $((C_2H_5O)_3SiCH_2CH_2)_3B$ (10 mmol) was dissolved in 80 ml of $CH_2Cl_2$ in a dry box, the reactor was then connected to a vacuum line, and 25.6 g of VDF (400 mmol) and 60 g of HFP (400 mmol) was condensed under vacuum by liquid nitrogen. About 5 mmol $O_2$ was charged into the reactor to oxidize borane moiety and initiate the polymerization that was carried out at 60° C. for 10 hours. After cooling down to room temperature and releasing the pressure, the mixture was transferred into a flask containing 100 ml of hexane. After stirring for 30 min, the polymer powder was filtered, washed, and then dried under vacuum at 60° C. for 6 hours. About 24 g of polymer (white soft wax) was obtained with yield of 28%. The polymer structure was confirmed by $^1H$ and $^{19}F$ NMR spectra.

TABLE 1

Summary of VDF/HFP copolymers containing terminal $(C_2H_5)_3OSi$ group(s) prepared by $((C_2H_5O)_3SiCH_2CH_2)_3B/O_2$ initiator

| Ex. | B (mmol) | $O_2$ (mmol) | VDF (mmol) | HFP (mmol) | Yield (%) | HFP (% mol) | Remark |
|---|---|---|---|---|---|---|---|
| 11 | 10.0 | 5.0 | 400 | 200 | 40 | 6.8 | White powder |
| 12 | 10.0 | 5.0 | 400 | 300 | 33 | 9.2 | White powder |
| 13 | 10.0 | 5.0 | 400 | 400 | 28 | 13.0 | Hard wax |
| 14 | 10.0 | 5.0 | 200 | 400 | 17 | 17.2 | viscose |

EXAMPLE 15

Synthesis of VDF/TrFE/CTFE Terpolymers Containing Terminal $(C_2H_5O)_3SiCH_2CH_2$— Groups The polymerization was carried out in a Parr high pressure reactor (75 ml) equipped with a magnetic stir bar; About 0.3 g ($0.5 \times 10^{-3}$ moles) of $((C_2H_5O)_3SiCH_2CH_2)_3B$ initiator (obtained from Example 1) was added into the reactor under the argon atmosphere. The autoclave was then vacuumed and cooled from outside by liquid nitrogen and 16.7 g (0.26 moles) of vinylidene fluoride (VDF), 7.6 g (0.09 moles) of trifluoroethylene (TrFE) and 1.7 g (0.015 moles) of chlorotrifluoroethylene (CTFE) were distilled into the autoclave. After the monomers and tributylborane had been added to the autoclave, $0.025 \times 10^{-3}$ moles of oxygen was introduced into the autoclave and the autoclave was warmed to ambient temperature. The bulk polymerization was continued at ambient temperature for 5 hours before vacuum-distilling any unreacted monomers. The resulting chain end functional terpolymer (6.5 g) was recovered, washed with methanol, and dried. According to chlorine analysis and $^1$H NMR measurements, the terpolymer contains terminal $(C_2HsO)_3SiCH_2CH_2$ group with a composition comprised 73.5 mole % VDF, 17.6 mole % TrFE and 8.9 mole % CTFE. The terpolymer had a peak melting temperature of 112° C., based on DSC measurements, and an intrinsic viscosity (MEK, 35° C.) of 0.41.

EXAMPLES 16-21

Synthesis of VDF/TrFE/CTFE Terpolymers Containing Terminal $(C_2H_5O)_3SiCH_2CH_2$— Groups A series of $(C_2H_5O)_3SiCH_2CH_2$ group terminated VDF/TrFE/CTFE terpolymers were prepared by using $((C_2H_5O)_3SiCH_2CH_2)_3B$ initiator, following the similar procedures described in Example 15, except varying monomer feed ratios and reaction conditions. The resulting terpolymers were analyzed by elemental analysis, $^1$H NMR, DSC, and intrinsic viscosity (MEK, 35° C.). Table 2 summarizes the reaction conditions and the experimental results.

monomers. The mixture was warmed to ambient temperature, and 0.27 mmoles of oxygen was introduced into the autoclave to oxidize organoborane and initiate polymerization. This bulk polymerization was continued at ambient temperature for 5 hours before venting any unreacted monomers. The resulting copolymer (11.3 g) was recovered, washed with methanol, and dried in a vacuum oven at 70° C. for 8 hours. According to chlorine analysis and $^1$H NMR measurements, the copolymer composition was comprised of 80.8 mole % VDF and 19.2 mole % CTFE.

The VDF/CTFE copolymer was further converted to VDF/TrFE/CTFE terpolymers by hydrogenation. In a typical example, about 1 g of the resulting VDF/CTFE copolymer (80.8/19.2 mol %) was dissolved in 25 mL of THF, then 0.206 mL (0.77 mmol) of tri(n-butyl)tin hydride and 0.015 g (0.091 mmol) of AIBN were added to the copolymer solution. The hydrogenation reaction took place at 60° C. for 12 hours. After the solvent was evaporated, the resulting VDF/TrFE/CTFE terpolymer washed with a large quantity of methanol, and dried. According to the chlorine analysis and $^1$H NMR measurements, the terpolymer composition was comprised of 80.8 mole % VDF, 11.2 mole % TrFE, and 8.0 mole % CTFE. Table 3 summarizes the experimental results of several terpolymers.

TABLE 3

A summary of thermal transition temperatures of VDF/TrFE/CTFE terpolymers prepared by hydrogenation of VDF/CTFE (80.8/19.2) copolymer

| Ex. no. | Hydrogenation (%) | Copolymer composition VDF/TrFE/CTFE (mole ratio) | Tm (° C.) | Tc (° C.) |
|---|---|---|---|---|
| 22 | — | 80.8/0/19.2 | Rubbery | — |
| 23 | 36 | 80.8/6.9/12.3 | Rubbery | — |
| 24 | 58 | 80.8/11.2/8.0 | 100 | 39 |
| 25 | 65 | 80.8/12.5/6.7 | 110 | 54 |
| 26 | 82 | 80.8/15.9/3.4 | 128 | 63 |
| 27 | 100 | 80.8/19.2/0 | 146 | 96 |

TABLE 2

Summary of VDF/TrFE/CTFE terpolymers containing terminal $(C_2H_5O)_3SiCH_2CH_2$ groups prepared by $((C_2H_5O)_3SiCH_2CH_2)_3B/O_2$ initiator

| Ex. No. | Monomer feed ratio (mol %) | | | Polymer composition (mol %) | | | Melting Temperature | | Curie Temperature* | | $(\eta)$ (MEK) |
|---|---|---|---|---|---|---|---|---|---|---|---|
| | VDF | TrFE | CTFE | VDF | TrFE | CTFE | Tm (° C.) | ΔH (J/g) | Tc (° C.) | ΔH (J/g) | (35° C.) |
| 16 | 71 | 25 | 4 | 70.5 | 19.5 | 10 | 119 | 24 | 26 | 0.3 | 0.42 |
| 17 | 71 | 26 | 3 | 71.8 | 20.2 | 8 | 121 | 21 | 25 | 0.4 | 0.72 |
| 18 | 71 | 27 | 2 | 72.2 | 21.3 | 6.5 | 127 | 24 | 24 | 0.8 | 0.55 |
| 19 | 64 | 32 | 4 | 63.1 | 25.4 | 11.5 | 114 | 18 | none | none | 0.49 |
| 20 | 54 | 42 | 4 | 58 | 33.1 | 8.9 | 124 | 21 | none | none | 0.63 |
| 21 | 50 | 47 | 3 | 56.2 | 36.5 | 7.3 | 126 | 20 | none | none | 0.73 |

*None reflects that a Curie temperature was not detected.

EXAMPLES 22-27

Synthesis of VDF/TrFE/CTFE Terpolymers Containing Terminal $(C_2H_5O)_3SiCH_2CH_2$— Groups by Hydrogenation of VDF/CTFE Copolymer The first step is the preparation of VDF/CTFE copolymer. About 0.10 g (0.55 mmol) of $((C_2H_5O)_3SiCH_2CH_2)_3B$ initiator was added into a 75-mL autoclave equipped with a magnetic stirrer under an argon atmosphere. The autoclave was then cooled by liquid nitrogen before vacuum distilling in 19 g (0.59 moles) of VDF and 7.1 g (0.061 moles) of CTFE

EXAMPLES 28-34

Synthesis of VDF/TrFE/CDFE Terpolymers Containing Terminal $(C_2H_5O)(CH_3)_2SiCH_2CH_2$— Groups A series of $(C_2H_5O)(CH_3)_2SiCH_2CH_2$ group terminated VDF/TrFE/CDFE terpolymers were prepared by using $((C_2H_5O)(CH_3)_2SiCH_2CH_2)_3B$ initiator, following the similar procedures described in Example 15, except varying initiator, CDFE monomer, monomer feed ratios and reaction conditions. The resulting terpolymers were analyzed by elemental analysis, $^1$H and $^{19}$F NMR, DSC, and intrinsic viscosity (MEK, 35° C.). Table 4 summarizes the experimental results. Apparently, the terminal silane group did not affect the terpolymer properties. Desirable properties, such as high dielectric constant and ambient Curie temperature, can be obtained in the chain-end functionalized terpolymer, which are basically governed by the composition of terpolymer and not by the chain ends.

EXAMPLES 35-40

Synthesis of VDF/TrFE/CFE Terpolymers Containing Terminal $(C_2H_5O)(CH_3)_2SiCH_2CH_2$— Groups Following the similar procedures described in Example 15, except using $((C_2H_5O)(CH_3)_2SiCH_2CH_2)_3B$ initiator, CFE monomer, monomer feed ratios and reaction conditions. The resulting terpolymers were analyzed by elemental analysis, $^1$H and $^{19}$F NMR, DSC, and intrinsic viscosity (MEK, 35° C.). A series of $(C_2H_5O)(CH_3)_2SiCH_2CH_2$ group terminated VDF/TrFE/CFE terpolymers are summarized in Table 5.

TABLE 5

Summary of VDF/TrFE/CFE terpolymers containing terminal $(C_2H_5O)(CH_3)_2SiCH_2CH_2$ groups prepared by $((C_2H_5O)(CH_3)_2SiCH_2CH_2)_3B/O_2$ initiator

| | Composition (mol %) | | | Melting Temp | | Curie temp | |
|---|---|---|---|---|---|---|---|
| Ex no. | VDF | TrFE | CFE | Tm (° C.) | ΔHm (J/g) | Tc (° C.) | ΔHc (J/g) |
| 35 | 60.1 | 29.3 | 1,1-CFE/10.6 | 115.1 | 24.5 | 11.3 | 1.8 |
| 36 | 62.4 | 29.8 | 1,1-CFE/7.8 | 138.5 | 18.5 | 25.2 | 1.6 |
| 37 | 63.4 | 30.4 | 1,1-CFE/6.2 | 141.8 | 27.5 | 37.3 | 8.6 |
| 38 | 65.3 | 31.4 | 1,2-CFE/3.3 | 147.7 | 24.4 | 49.5 | 8.2 |
| 39 | 65.5 | 30.8 | 1,2-CFE/3.7 | 142.2 | 25.3 | 30.8 | 5.0 |
| 40 | 63.9 | 30.1 | 1,2-CFE/6.0 | 138.0 | 25.0 | 25.0 | 4.0 |

EXAMPLES 41-44

Synthesis of VDF/TrFE/VC and VDF/TrFE/VF Terpolymers Containing Terminal $(C_2H_5O)(CH_3)_2SiCH_2CH_2$— Groups Following the similar procedures described in Example 15, except using $((C_2H_5O)(CH_3)_2SiCH_2CH_2)_3B$ initiator, vinyl chloride (VC) or vinyl fluoride (VF) monomer, monomer feed ratios and reaction conditions. A series of $(C_2H_5O)(CH_3)_2SiCH_2CH_2$ group terminated VDF/TrFE/VC and VDF/TrFE/VF terpolymers are summarized in Table 6.

TABLE 6

Summary of VDF/TrFE/VC and VDF/TrFE/VF terpolymers containing Terminal $(C_2H_5O)(CH_3)_2SiCH_2CH_2$ groups prepared by $((C_2H_5O)(CH_3)_2SiCH_2CH_2)_3B/O_2$ initiator

| | Composition (mol %) | | | Melting Temp | | Curie temp | |
|---|---|---|---|---|---|---|---|
| Ex no. | VDF | TrFE | CFE | Tm (° C.) | ΔHm (J/g) | Tc (° C.) | ΔHc (J/g) |
| 41 | 55.1 | 33.1 | VC/11.8 | 103.0 | 18.2 | 14.0 | 2.1 |
| 42 | 58.3 | 34.7 | VC/7.0 | 132.8 | 25.3 | 27.7 | 4.5 |
| 43 | 66.7 | 30.5 | VF/2.8 | 161.1 | 29.9 | 81.1 | 16.4 |
| 44 | 53.8 | 38.8 | VF/7.4 | 171.2 | 27.9 | 103.3 | 9.0 |

EXAMPLES 45-48

Synthesis of VDF/TrFE/HFP Terpolymers Containing Terminal $(C_2H_5O)(CH_2)_2SiCH_2CH_2$— Groups Following the similar procedures described in Example 15, except using $((C_2H_5O)(CH_3)_2SiCH_2CH_2)_3B$ initiator, hexafluoropropene (HFP) monomer, monomer feed ratios and reaction conditions. A series of $(C_2H_5O)(CH_3)_2SiCH_2CH_2$ group terminated VDF/TrFE/HFP terpolymers are summarized in Table 7.

TABLE 7

Summary of VDF/TrFE/HFP terpolymers containing terminal $(C_2H_5O)(CH_3)_2SiCH_2CH_2$ groups prepared by $((C_2H_5O)(CH_3)_2SiCH_2CH_2)_3B/O_2$ initiator

| | Composition (mol %) | | | Melting Temp | | Curie temp | |
|---|---|---|---|---|---|---|---|
| Ex no. | VDF | TrFE | HFP | Tm (° C.) | ΔHm (J/g) | Tc (° C.) | ΔHc (J/g) |
| 45 | 52.6 | 46.6 | 0.8 | 139.3 | 23.2 | 49.5 | 9.3 |
| 46 | 54.3 | 43.8 | 1.8 | 128.3 | 18.0 | 40.6 | 4.1 |

TABLE 7-continued

Summary of VDF/TrFE/HFP terpolymers containing terminal $(C_2H_5O)(CH_3)_2SiCH_2CH_2$ groups prepared by $((C_2H_5O)(CH_3)_2SiCH_2CH_2)_3B/O_2$ initiator

| | Composition (mol %) | | | Melting Temp | | Curie temp | |
|---|---|---|---|---|---|---|---|
| Ex no. | VDF | TrFE | HFP | Tm (° C.) | ΔHm (J/g) | Tc (° C.) | ΔHc (J/g) |
| 47 | 55.2 | 42.4 | 2.5 | 129.1 | 15.6 | 35.6 | 2.6 |
| 48 | 63.1 | 29. | 7.0 | 96.3 | 6.8 | 28.5 | 3.3 |

EXAMPLE 49

Synthesis of VDF/TrFE/$CF_2$=$CFCH_2CH_2Si(CH_3)_2H$ Terpolymer Containing Terminal $(C_2H_5O)_3SiCH_2CH_2$ Groups The control radical polymerization was conducted in a 70 ml stainless autoclave equipped with a magnetic stirrer. After adding 3.0 g of $CF_2$=$CFCH_2CH_2Si(CH_3)_2H$, 0.2 g of $((C_2H_5O)_3SiCH_2CH_2)_3B$, and 20 ml $CH_3CN$ under argon, 20 ml of VDF and 7 ml of TrFE were introduced into the reactor under vacuum by condensing the monomers at liquid nitrogen temperatures. About 15 ml of $O_2$ was then introduced to initiate the polymerization. The autoclave was slowly warmed to room temperature and then immersed in an oil bath at 80° C. for 10 hours. After recovering the unreacted monomers, the slurry was dried under vacuum to obtain 5.5 g of a white polymer powder, with 45% yield. According to chlorine analysis and $^1$H and $^{19}$F NMR measurements, the terpolymer contains both $(C_2H_5O)_3Si$ and $Si(CH_3)_2H$ groups with a composition comprised 63.5 mole % VDF, 35.5 mole % TrFE and 1.0 mole % $CF_2\!\!=\!\!CFCH_2CH_2Si(CH_3)_2H$. The terpolymer had a peak melting temperature of 135° C., based on DSC measurement, and an intrinsic viscosity (MEK, 35° C.) of 0.72.

EXAMPLE 50

Synthesis of VDF/TrFE/$CF_2\!\!=\!\!CFCH_2CH_2OSi(CH_3)_3$ Terpolymer Containing Terminal $(C_2H_5O)_3SiCH_2CH_2$— Groups Following similar procedures in Example 49, 2.7 g of $CF_2\!\!=\!\!CFCH_2CH_2OSi(CH_3)_3$, 0.2 g of $((C_2H_5O)_3SiCH_2CH_2)_3B$, and 20 ml $CH_3CN$ under argon, 20 ml of VDF and 7 ml of TrFE were introduced into the reactor under vacuum before adding 15 ml of $O_2$ to initiate the polymerization. The autoclave was slowly warmed to room temperature and then immersed in an oil bath at 80° C. for 10 hours. After recovering the unreacted monomers, the slurry was dried under vacuum to obtain 6.5 g of a white polymer that contains both $(C_2H_5O)_3Si$ and $Si(CH_3)_3$ groups with a composition comprised 63.9 mole % VDF, 34.5 mole % TrFE and 1.6 mole % $CF_2\!\!=\!\!CFCH_2CH_2OSi(CH_3)_3$. The terpolymer had a peak melting temperature of 132° C., based on DSC measurement, and an intrinsic viscosity (MEK, 35° C.) of 0.76.

EXAMPLE 51

Synthesis of VDF/HFP Copolymer by Functional Acetyl Peroxide Initiator

A 10 ml ($1.0\times10^{-4}$ mol) of the 2-bromo-ethyl acetyl peroxide catalyst in ether solution (obtained from Example 6) was injected into a 75 ml stainless steel bomb reactor. The solvent was then removed by vacuum distillation at −30° C. After that, 20 ml (0.19 mol) of VDF, and 10 ml (0.1 mol) of HFP were vacuum condensed into the reactor at liquid $N_2$ temperature. The reactor was then slowly warmed up to 50° C. and maintained at this polymerization temperature for 18 h, before vacuum removal of the unreacted monomer(s). The VDF/HFP polymer obtained, 5 g (about 18% conversion), was then dissolved in acetone and precipitated with water/methanol several times to remove the impurities, and finally vacuum dried at 70° C.

EXAMPLES 52-57

Synthesis of VDF/TrFE/CTFE Terpolymers by Acetyl Peroxide Initiators

Several functional peroxide initiators (obtained from Example 6) were also investigated. To minimize the side reactions, low temperature peroxide initiators bearing bromine and double bond were chosen, with the use of the bulk process that has pure monomers in the condensed phase. Table 8 summarizes the experimental results involving 3 acetyl peroxide initiators, i.e. $(Br\!-\!CH_2CH_2C(\!\!=\!\!O)O\!-\!)_2$, $(CH_2\!\!=\!\!CHCH_2C(\!\!=\!\!O)O\!-\!)_2$, and $(CH2\!\!=\!\!CHOC(\!\!=\!\!O)O\!-\!)_2$. In general, monomer conversions are quite poor and polymer molecular weight are very low, only the $(Br\!-\!CH_2CH_2C(\!\!=\!\!O)O\!-\!)_2$ initiator with high concentration produces polymer with decent yield. Infrared spectra of the resulting polymers show a weak absorbance peaks around 1780 cm$^{-1}$, which is the characteristic peak of the carbonyl group that exists in the functional initiators.

TABLE 8

Summary of the polymerization results by three low temperature peroxide initiators

| Ex No. | Initiator* | Monomer (feed ratio)** | Polymerization conditions | | |
|---|---|---|---|---|---|
| | | | Catalyst (mol) | Temp/Time | Conversion (%) |
| 52 | A | VDF/TrFE/CTFE/54/42/4 | $1.0\times10^{-3}$ | 50° C./20 h | 15 |
| 53 | A | VDF/TrFE/CTFE/54/42/4 | $4.0\times10^{-3}$ | 50° C./20 h | 31 |
| 54 | B | VDF/TrFE/CTFE/54/42/4 | $4.0\times10^{-3}$ | 50° C./20 h | 5 |
| 55 | B | VDF/TrFE/CTFE/54/42/4 | $4.0\times10^{-3}$ | 70° C./20 h | Trace |
| 56 | C | VDF/TrFE/53/47 | $1.0\times10^{-3}$ | 50° C./20 h | 5 |
| 57 | C | VDF/TrFE/CTFE/54/42/4 | $4.0\times10^{-3}$ | 50° C./20 h | 8 |

*INITIATOR A: $(BR\!-\!CH_2CH_2OC(\!\!=\!\!O)O\!-\!)_2$, B: $(CH_2\!\!=\!\!CHCH_2OC(\!\!=\!\!O)O\!-\!)_2$, C: $(CH2\!\!=\!\!CHOC(\!\!=\!\!O)O\!-\!)_2$.
**MONOMER FEED: 25 ML VDF/12 ML TRFE/1.3 ML CTFE (54/42/4), AND 25 ML VDF/12.5 ML TRFE (53/47).

EXAMPLES 58-61

Synthesis of VDF/TrFE/CTFE Terpolymers by $H_2O_2$ Initiator

In one example, 0.2 ml ($1.8\times10^{-3}$ mol) of aqueous hydrogen peroxide (30 wt %) and 100 ml acetonitrile were mixed in a 200 ml reactor. The reactor was vacuumed to remove air, then, 25 ml (0.24 mol) of VDF, 12.5 ml (0.19 mol) of TrFE, and 1.3 ml of (0.15 mol) CTFE was vacuum distilled into the reactor at the liquid nitrogen temperature. The reactor was then rapidly heated up to 100° C. and maintained at this temperature for 4 h. After that, the unreacted monomer was then vacuum recovered, and the polymer solution was precipitated in methanol/water mixture to obtain the white solid powder. The polymer solid was then dissolved in acetone and precipitated with methanol/water several times to remove the impurities, and finally vacuum dried at 70° C. to get 8.6 g (32.6% conversion). The composition of the terpolymer measured by $^1$H NMR and elemental analysis is VDF/TrFE/CTFE=62.9/30.3/6.8. Mole average molecular weight (Mn) of polymer was about 25,000 with molecular weight distribution of 2.0, measured by GPC. Table 9 summarizes several VDF/TrFE/CTFE terpolymers prepared by hydroperoxide initiator. Overall, the polymer yields are reasonably good and are dependent on the concentration of ($H_2O_2$) that has an optimum value of about 2% for the VDF/TrFE/CTFE terpolymer. The polymer molecular weight is basically controlled by the ratio of the (catalyst)/(monomer), the higher the ratio the lower the molecular weight. The resulting polymers range from low molecular weight (white soft wax) to high molecular weight (white powder).

TABLE 9

Summary of VDF/TrFE/CTFE terpolymers prepared by $H_2O_2$ initiator.

| Ex no. | Monomer feed (mol ratio) | Polymer composition (mol ratio) | Catalyst $(H_2O_2)/(M)$ (%) | Conversion (%) | Mn/Mw/PDI $\times 10^{-3}$ |
|---|---|---|---|---|---|
| 58 | 54/42/4 | 63.0/30.4/6.6 | 10 | 60.9 | 3.1/6.8/2.2 |
| 59 | 54/42/4 | 60.2/32.6/7.2 | 5 | 77.5 | 6.6/11.9/1.8 |
| 60 | 54/42/4 | 69.5/24.7/5.8 | 2 | 90.0 | 10.0/16.3/1.6 |
| 61 | 54/42/4 | 62.9/30.3/6.8 | 0.4 | 51.6 | 14.7/29.6/2.0 |

Polymerization conditions: temperature = 100° C., time = 4 h., solvent = 100 ml acetonitrile

EXAMPLES 62-66

Synthesis of VDF/TrFE/CTFE Terpolymers by AIBN//α,ω-diiodoperfluorobutane Initiator In a typical reaction, the AIBN initiator 0.3 g (1.83×10-3 mol) was dissolved in 30 ml acetonitrile solvent and was placed into a 75 ml stainless steel reactor. Diiodo-perfluorobutane chain transfer agent 0.4 g (0.84×10-3 mole) was then added to the solution in the reactor. After the reactor was vacuumed to remove air, 25 ml (0.24 mol) of VDF, 12.5 ml (0.19 mol) of TrFE, and 1.3 ml of (0.15 mol) CTFE monomers were then vacuum distilled into the reactor at liquid nitrogen temperature. The reactor was rapidly heated up to 80° C. and maintained at this temperature for 4 h. After removing the unreacted monomer, the polymer solution was precipitated in methanol/water mixture and purified twice by dissolving in acetone and reprecipitated with water/methanol mixture. The composition of the polymer obtained, 16.0 g (48.5% conversion), was 68.7/25.5/5.8 VDF/TrFE/CTFE with a mole average molecular weight (Mn) of about 20000 and molecular weight distribution of 1.7.

After adding about 10 ml of 6N $HCl/H_2O$ solution, the mixture was stirred at room temperature for 5 hours at room temperature. After removing all the volatiles, the attained polymer washed with 30 ml of methanol, three times, and dried under vacuum for 24 hours at 80° C. Based on $^1H$ NMR spectra, the conversion of O—Si$(CH_3)_3$ to —OH was greater than 98%.

EXAMPLE 68

Synthesis of VDF/TrFE Copolymer Containing Cinnamoyl Groups

The VDF/TrFE/$CF_2$=CFCH$_2$CH$_2$OH terpolymer containing OH groups (2 g) obtained from Example 67 was dissolved in 30 ml of THF. After adding 2.0 g of pyridine and 2.0 g of cinnamoyl chloride, the mixture was stirred and refluxed for 5 hours. After removing all the volatiles, the attained polymer washed with 30 ml of methanol, three times, and dried under vacuum for 24 hours at 80° C. Based on $^1H$ NMR spectra, the conversion of O—H to —O—C(=O)CH=CH—$C_6H_5$ was greater than 95%.

EXAMPLE 69

Cross-Linking of VDF/TrFE Copolymer Containing Cinnamoyl Groups by UV Irradiation About 50 mg of VDF/TrFE copolymer containing cinnamoyl groups obtained from Example 68 was completely dissolved in 0.5 ml of acetone. The homogeneous polymer solution was then exposed to UV irradiation for 30 seconds. Gel particles were immediately observed in the solution. FTIR spectrum of the resulting insoluble polymer showed high conversion (>85%) of —O—C(=O)CH=CH—$C_6H_5$ into cyclic butyl structure (crosslinker).

Only the preferred embodiment of the present invention and examples of its versatility are shown and described in the present disclosure. It is to be understood that the present invention is capable of use in various other combinations and environments and is capable of changes or modifications

TABLE 10

Summary of VDF/TrFE/CTFE terpolymers initiated by AIBN/α,ω-diiodoperfluorobutane

| Ex. no. | Polymer composition | Yield/ Time (h) | Mn/Mw ×10$^{-3}$ | Iodine/ Chain | Melting Temp Tm (° C.) | ΔH (J/g) | Curie Temp Tc (° C.) | ΔH$_c$ (J/g) |
|---|---|---|---|---|---|---|---|---|
| 62 | 69.3/23.2/7.5 | 26/3 | 9.6/18.2 | 2.0 | 113.7 | 20.9 | 23.7 | 3.3 |
| 63 | 62.9/29.4/7.7 | 30/4 | 9.8/19.0 | 2.0 | 118.2 | 23.2 | 27.6 | 4.9 |
| 64 | 72.7/21.3/6.0 | 36/6 | 11.1/19.1 | 1.6 | 117.9 | 24.3 | 28.6 | 5.1 |
| 65 | 67.7/26.7/5.6 | 51/8 | 16.1/35.7 | 1.8 | 125.3 | 26.9 | 32.5 | 7.0 |
| 66 | 67.2/27.6/5.2 | 65/10 | 20.2/32.1 | 1.8 | 126.0 | 27.6 | 33.0 | 6.3 |

Polymerization conditions: polymerization temperature = 80° C., polymerization time = 4 h., solvent = 30 ml acetonitrile, AIBN amount = 1.83 × 10-3 mol. I(CF2)2I = 1.76 × 10-3 mol.

EXAMPLE 67

Synthesis of VDF/TrFE/CF2=CFCH2CH2OH Terpolymer

The VDF/TrFE/$CF_2$=CFCH$_2$CH$_2$OSi$(CH_3)_3$ (63/35/2 mole % ratio) terpolymer (2 g) was dissolved in 30 ml THF.

within the scope of the inventive concept as expressed herein. Thus, for example, those skilled in the art will recognize, or be able to ascertain, using no more than routine experimentation, numerous equivalents to the specific substances and procedures described herein. Such equivalents are considered to be within the scope of this invention, and are covered by the following claims.

What is claimed is:

1. A composite material prepared by mixing a chain end functionalized fluoropolymer and a dielectric material;

wherein the chain end functionalized fluoropolymer has the following formula:

X-(fluoropolymer)-Y    (I)

wherein, fluoropolymer represents the polymerization product of vinylidene fluoride (VDF) and a second monomer selected from the group consisting of a fluoromonomer, a mixture of fluoromonomers, and a mixture of one or more non-fluoromonomers and one or more hydrocarbon monomers, wherein the second monomer has from 2 to 15 carbon atoms; X and Y are independently the same or a different terminal group provided that at least one of X or Y is selected from the group consisting of $Si(R)_n(OH)_{3-n}$, $Si(R)_n(OR)_{3-n}$, OH, COOH, COOR, anhydride, ammonium, immidazolium, sulfonium, and phosphonium ions, wherein n is from 0 to 2, and R is a $C_1$-$C_6$ alkyl group, and wherein the chain end functionalized fluoropolymer has a breakdown electric field of more than 100 MV/m and a dielectric constant of at least 10 when measured at any temperature between 20 and 100° C.

2. The composite material of claim 1 wherein the fluoromonomers are selected from the group consisting of vinyl fluoride (VF), trifluoroethylene (TrFE), tetrafluoroethylene (TFE), hexafluoropropene (HFP), 1-chloro-1-fluoro-ethylene(1,1-CFE),1-chloro-2-fluoro-ethylene(1,2-CFE),1-chloro-2,2-difluoroethylene (CDFE), chlorotrifluoroethylene (CTFE), trifluorovinyl monomers, 1,1,2-trifluorobutene-4-bromo-1-butene, 1,1,2-trifluorobutene-4-silane-1-butene, perfluoroalkyl vinyl ethers, perfluoromethyl vinyl ether (PMVE), perfluoropropyl vinyl ether (PPVE), perfluoro acrylates, 2,2,2-trifluoroethyl acrylate and 2-(perfluorohexyl) ethyl acrylate.

3. The composite material of claim 1 wherein the fluoropolymer is the copolymerization product of from about 50 to about 95 mole % vinylidene fluoride (VDF) and from about 5 to about 50 mole % of the second monomer.

4. The composite material of claim 1 wherein the fluoropolymer is the terpolymerization product of from about 50 to about 95 mole % vinylidene fluoride (VDF), from about 5 to about 40 mole % trifluoroethylene (TrFE), and from about 1 to about 20 mole % of at least one third-monomer.

5. The composite material of claim 4 wherein the third-monomer is selected from the group consisting of chlorotrifluoroethylene (CTFE), 1-chloro-1-fluoro-ethylene(1,1-CFE),1-chloro-2-fluoro-ethylene(1,2-CFE),1-chloro-2,2-difluoroethylene (CDFE), hexafluoropropene (HFP), trifluorovinyl functional monomers, 1,1,2-trifluorobutene-4-bromo-1-butene and 1,1,2-trifluorobutene-4-silane-1-butene, perfluoroalkyl vinyl ethers, perfluoromethyl vinyl ether (PMVE), perfluoropropyl vinyl ether (PPVE), perfluoro acrylates and methacrylates, 2,2,2-trifluoroethyl acrylate, 2-(perfluorohexyl)ethyl acrylate, and mixtures thereof.

6. The composite material of claim 1 wherein both X and Y are selected from the group consisting of $Si(R)_n(OH)_{3-n}$, $Si(R)_n(OR)_{3-n}$, OH, COOH, COOR, anhydride, ammonium, immidazolium, sulfonium, and phosphonium ions.

7. The composite material of claim 1 wherein the dielectric constant of the chain end functionalized fluoropolymer is at least 10 when measured at a temperature between about 20° C. to about 25° C.

8. The composite material of claim 1 wherein the chain end functionalized fluoropolymer has a breakdown electric field of more than 200 MV/m and a dielectric constant of at least 20.

9. The composite material of claim 1 wherein the dielectric material has a dielectric constant of at least 50.

10. The composite material of claim 1, comprising from about 60 to about 99 parts by weight of the functional fluoropolymer and from 1 to 40 parts by weight of the dielectric material.

11. The composite material of claim 1, wherein the dielectric material is selected from the group consisting of a piezoelectric material, a metal oxide, barium-titanium-oxide BTO, lead-zirconate-titanate PZT and copper phthalocyanine (CuCy).

12. A composite material comprising a chain end functionalized fluoropolymer and a second material, wherein the chain end functionalized fluoropolymer has the following formula:

X-(fluoropolymer)-Y    (I)

wherein, fluoropolymer represents the polymerization product of vinylidene fluoride (VDF) and a second monomer selected from the group consisting of a fluoromonomer, a mixture of fluoromonomers, and a mixture of one or more non-fluoromonomers and one or more hydrocarbon monomers, wherein the second monomer has from 2 to 15 carbon atoms; X and Y are independently the same or a different terminal group provided that at least one of X or Y is a functional terminal group, and wherein the chain end functionalized fluoropolymer has a breakdown electric field of more than 100 MV/m and a dielectric constant of at least 10 when measured at any temperature between 20 and 100° C.; and wherein said second material is a corresponding fluoropolymer, without functional groups, that is compatible with the chain end functionalized fluoropolymer.

13. The composite material of claim 12 wherein the chain end functionalized fluoropolymer has a breakdown electric field of more than 200 MV/m and a dielectric constant of at least 20.

* * * * *